(12) United States Patent
Shim et al.

(10) Patent No.: US 12,056,027 B2
(45) Date of Patent: Aug. 6, 2024

(54) MEMORY SYSTEM AND DATA PROCESSING SYSTEM INCLUDING THE SAME

(71) Applicant: SK hynix Inc., Gyeonggi-do (KR)

(72) Inventors: Eung-Bo Shim, Gyeonggi-do (KR); Hyung-Sup Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 56 days.

(21) Appl. No.: 17/949,287

(22) Filed: Sep. 21, 2022

(65) Prior Publication Data

US 2023/0015404 A1 Jan. 19, 2023

Related U.S. Application Data

(60) Division of application No. 16/851,660, filed on Apr. 17, 2020, now Pat. No. 11,636,014, which is a
(Continued)

(30) Foreign Application Priority Data

Oct. 31, 2017 (KR) .......................... 10-2017-0143428
Nov. 8, 2017 (KR) .......................... 10-2017-0148004
(Continued)

(51) Int. Cl.
*G06F 11/20* (2006.01)
*G06F 11/07* (2006.01)
(Continued)

(52) U.S. Cl.
CPC ........ *G06F 11/2094* (2013.01); *G06F 11/073* (2013.01); *G06F 11/076* (2013.01);
(Continued)

(58) Field of Classification Search
CPC .. G06F 11/2094; G06F 11/073; G06F 11/076; G06F 11/1658; G06F 11/20;
(Continued)

(56) References Cited

U.S. PATENT DOCUMENTS 5,581,713 A 12/1996 Myers et al.
7,293,221 B1 * 11/2007 Wong .................. G06F 11/1016
714/768
(Continued)

FOREIGN PATENT DOCUMENTS

CN 102681868 A 9/2012
CN 102804156 A 11/2012
(Continued)

OTHER PUBLICATIONS

Office Action for the Chinese Patent Application No. 201911187737.8 including Search Report, issued by the Chinese Patent Office on Dec. 28, 2022.
(Continued)

*Primary Examiner* — John J Tabone, Jr.
(74) *Attorney, Agent, or Firm* — IP & T GROUP LLP

(57) ABSTRACT

A memory system and a data processing system including the memory system may manage a plurality of memory devices. For example, the data processing system may categorize and analyze error information from the memory devices, acquire characteristic data from the memory devices and set operation modes of the memory devices based on the characteristic data, allocate the memory devices to a host workload, detect a defective memory device among the memory devices and efficiently recover the defective memory device.

3 Claims, 29 Drawing Sheets

US 12,056,027 B2
Page 2

Related U.S. Application Data continuation-in-part of application No. 16/189,984, filed on Nov. 13, 2018, now Pat. No. 11,048,573, and a continuation-in-part of application No. 16/674,935, filed on Nov. 5, 2019, now Pat. No. 11,221,931, and a continuation-in-part of application No. 16/041,258, filed on Jul. 20, 2018, now Pat. No. 11,016,666, and a continuation-in-part of application No. 16/039,220, filed on Jul. 18, 2018, now Pat. No. 10,928,871.

(30) Foreign Application Priority Data

| Jan. 12, 2018 | (KR) | 10-2018-0004390 |
|---|---|---|
| Jan. 15, 2019 | (KR) | 10-2019-0005161 |

(51) Int. Cl.

| G06F 11/16 | (2006.01) |
|---|---|
| G06F 11/30 | (2006.01) |
| G06F 11/32 | (2006.01) |
| G11C 29/00 | (2006.01) |
| G11C 29/08 | (2006.01) |
| G11C 29/42 | (2006.01) |
| G11C 29/44 | (2006.01) |
| G11C 29/52 | (2006.01) |

(52) U.S. Cl.

CPC .......... *G06F 11/1658* (2013.01); *G06F 11/20* (2013.01); *G06F 11/3037* (2013.01); *G06F 11/326* (2013.01); *G11C 29/08* (2013.01); *G11C 29/42* (2013.01); *G11C 29/4401* (2013.01); *G11C 29/52* (2013.01); *G11C 29/765* (2013.01); *G11C 29/81* (2013.01); *G11C 29/832* (2013.01); *G06F 2201/82* (2013.01); *G11C 2029/4402* (2013.01)

(58) Field of Classification Search

CPC ............... G06F 11/3037; G06F 11/326; G06F 2201/82; G11C 29/08; G11C 29/42; G11C 29/4401; G11C 29/52; G11C 29/765; G11C 29/81; G11C 29/832; G11C 2029/4402

USPC ........ 714/718, 719, 723, 733, 742; 365/200, 365/201

See application file for complete search history.

(56) References Cited

U.S. PATENT DOCUMENTS

| 11,340,972 | B1* | 5/2022 | Jeon | G06F 11/0727 |
|---|---|---|---|---|
| 2006/0039196 | A1* | 2/2006 | Gorobets | G11C 29/76 |
| | | | | 714/E11.038 |
| 2006/0212778 | A1 | 9/2006 | Wheeler et al. | |
| 2009/0300709 | A1* | 12/2009 | Chen | H04L 67/10 |
| | | | | 726/1 |
| 2010/0238779 | A1* | 9/2010 | Chen | G11B 20/1879 |
| | | | | 714/763 |
| 2010/0325372 | A1 | 12/2010 | Housty et al. | |
| 2010/0332189 | A1 | 12/2010 | Urmanov et al. | |
| 2011/0219259 | A1 | 9/2011 | Frost et al. | |
| 2011/0231743 | A1 | 9/2011 | Sakamaki | |
| 2012/0159255 | A1* | 6/2012 | Havewala | G06F 11/1435 |
| | | | | 714/37 |
| 2012/0239973 | A1 | 9/2012 | Walton et al. | |
| 2015/0262706 | A1 | 9/2015 | Curley et al. | |
| 2016/0055059 | A1* | 2/2016 | Hu | G06F 11/1008 |
| | | | | 714/764 |
| 2016/0291985 | A1 | 10/2016 | Jenkins et al. | |
| 2017/0102985 | A1* | 4/2017 | Song | G06F 11/079 |
| 2017/0123879 | A1 | 5/2017 | Donlin | |
| 2018/0144136 | A1 | 5/2018 | Nadarajah et al. | |
| 2018/0204773 | A1 | 7/2018 | Jeong et al. | |
| 2023/0015404 | A1* | 1/2023 | Shim | G06F 11/3037 |

FOREIGN PATENT DOCUMENTS

| CN | 104798047 A | 7/2015 |
|---|---|---|
| CN | 105304144 A | 2/2016 |
| KR | 20120085968 A | 8/2012 |
| KR | 20130026973 A | 3/2013 |
| KR | 20170104112 A | 9/2017 |
| WO | 2011082362 A1 | 7/2011 |
| WO | 2015072028 A1 | 5/2015 |

OTHER PUBLICATIONS

Office Action (Notice of Refusal) for the Korean Patent Application No. 10-2019-0005161 issued by the Korean Intellectual Property Office on Nov. 9, 2023.

Office Action for the Chinese Patent Application No. 201811582225.7 issued by the Chinese Patent Office on Oct. 21, 2022.

Office Action issued by the USPTO for U.S. Appl. No. 17/323,135 on Jun. 21, 2023.

Rejection Decision by the Chinese Patent Office for Application No. 201811582225.7 on Jun. 27, 2023.

Notice of Allowance for the Chinese Patent Application No. 201911187737.8 issued by the Chinese Patent Office on May 11, 2023.

Notice of Allowance for the Korean Patent Application No. 10-2018-0004390 issued by the Korean Intellectual Property Office on Oct. 4, 2022.

* cited by examiner

MEMORY SYSTEM AND DATA PROCESSING SYSTEM INCLUDING THE SAME

CROSS-REFERENCE TO RELATED APPLICATION

The present application is a divisional application of U.S. patent application Ser. No. 16/851,660 filed on Apr. 17, 2020. The '660 application is a continuation-in-part application of U.S. patent application Ser. No. 16/674,935 filed on Nov. 5, 2019 and issued as U.S. Pat. No. 11,221,931 on Jan. 11, 2022, which claims priority to Korean patent application No. 10-2019-0005161 filed on Jan. 15, 2019; U.S. patent application Ser. No. 16/189,984 filed on Nov. 13, 2018 and issued as U.S. Pat. No. 11,048,573 on Jun. 29, 2021, which claims priority to Korean patent application No. 10-2018-0004390 filed on Jan. 12, 2018; U.S. patent application Ser. No. 16/041,258 filed on Jul. 20, 2018 and issued as U.S. Pat. No. 11,016,666 on May 25, 2021, which claims priority to Korean patent application No. 10-2017-0148004 filed on Nov. 8, 2017; and U.S. patent application Ser. No. 16/039,220 filed on Jul. 18, 2018 and issued as U.S. Pat. No. 10,928,871 on Feb. 23, 2021, which claims priority to Korean patent application No. 10-2017-0143428 filed on Oct. 31, 2017. The disclosure of each of the foregoing applications is herein incorporated herein by reference in its entirety.

BACKGROUND

1. Field

Various embodiments of the present invention relate to a data processing system. Particularly, the embodiments relate to a system and a method for substantially maintaining an error of data stored in a memory device.

2. Discussion of the Related Art

Data are becoming important assets in the fourth industrial revolution, and the demands for new technology in support of transferring and analyzing large-scale data at a high data rate are increasing. For example, as artificial intelligence, autonomous driving, robotics, health care, virtual reality (VR), augmented reality (AR), and smart home technologies spread, demands for servers or data centers are increasing.

A legacy data center includes resources for computing, networking, and storing data, in the same equipment. However, a future large-scale data center may construct resources individually and then logically restructure the resources. For example, in the large-scale data center, the resources may be modularized at the level of racks, and the modularized resources may be restructured and supplied according to the usage. Therefore, a converged storage or memory device, which can be used for the future large-scale data center, is demanded.

SUMMARY

Various embodiments are directed to a system and a method for managing memory devices. More particularly, various embodiments are directed to a system and a method for categorizing and analyzing error information from the memory devices, acquiring characteristic data from the memory devices, setting operation modes of the memory devices based on the characteristic data, allocating the memory devices to a host workload, detecting a defective memory device among the memory devices and efficiently recovering the defective memory device.

In an embodiment, a memory system may include: a plurality of memory devices each configured to store data, correct an error of the data and generate error information including error details; and a controller configured to acquire the error information from the plurality of memory devices and categorize the error information according to an error categorization criterion.

In an embodiment, a data processing system may include: a plurality of memory systems and a compute system, wherein each of the plurality of memory systems includes: a plurality of memory devices each configured to store data, correct an error of the data and generate first error information including error details, and a controller configured to acquire the first error information from the plurality of memory devices and generate second error information based on plural pieces of first error information received from the plurality of memory devices; and wherein the compute system analyzes the second error information received from the plurality of memory systems.

In an embodiment, a data processing may include: a compute system; and a memory system comprising a plurality of groups of memory devices each includes a serial presence detect (SPD) component and a plurality of controllers each coupled to a corresponding group of memory devices, wherein each of the controllers acquires characteristic data from the SPD components in the corresponding group of memory devices when power is supplied, providing the acquired characteristic data to the compute system.

In an embodiment, a data processing system may include: a memory system including a plurality of memory devices each having type depending on latency for read and write operation; and a compute system coupled to the memory system, wherein the compute system includes a database memory suitable for storing a write-to-read-ratio information indicating a ratio of write operation to read operation of respective types of workloads, and allocates a memory device, for processing a current workload, based on the type of the memory device and the write-to-read-ratio information of the current workload.

In an embodiment, a memory system may include: a plurality of memory devices including a spare memory device; and a controller suitable for controlling the plurality of memory devices, and wherein the controller periodically checks whether each of the plurality of memory devices is a defective memory device, copies data from the defective memory device to the spare memory device and cuts off a power of the defective memory device.

In an embodiment, a data processing system may include: a plurality of memory systems; and a compute system configured to deliver requests among the plurality of memory systems based on a global map that includes information on each of the plurality of memory systems, wherein each of the plurality of memory systems includes: a plurality of normal memory devices and a shared memory device; and a controller suitable for controlling the plurality of normal memory devices and the shared memory device, and wherein the controller provides a power to the plurality of normal memory devices and the shared memory device independently, receives a request provided from other memory system, provides requested data to the other memory system from target memory device among the plurality of memory devices based on meta information of data for the request and copy the requested data into the shared memory device.

DETAILED DESCRIPTION

Figure 1:
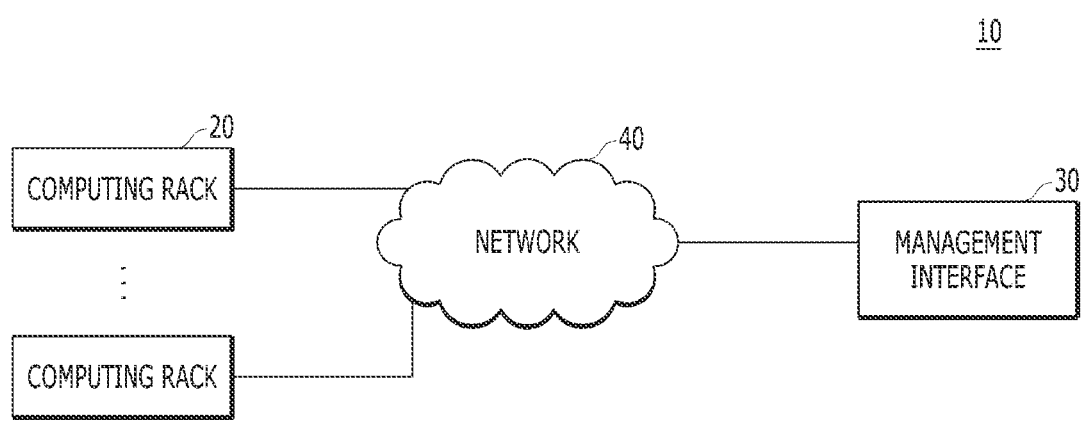
FIG. 1 is a diagram schematically illustrating an example of a data processing system including a memory system in accordance with an embodiment.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

The terminology used herein is for the purpose of describing particular embodiments only and is not intended to be limiting of the present invention.

As used herein, singular forms may include the plural forms as well and vice versa, unless the context clearly indicates otherwise.

It is also noted, that in some instances, as would be apparent to those skilled in the relevant art, an element also referred to as a feature described in connection with one embodiment may be used singly or in combination with other elements of another embodiment, unless specifically indicated otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a diagram illustrating a data processing system 10. Referring to FIG. 1, the data processing system 10 may include a plurality of computing racks 20, a management interface 30, and a network 40 that enables communication between the computing racks and the management interface 30. The data processing system having such a rack scale architecture may be used, for example, a data center and the like for mass data processing.

Each of the plurality of computing racks 20 may implement one computing system through a combination with other computing racks 20. Detailed configuration and operation of such computing racks 20 will be described later.

The management interface 30 may provide an interactive interface by which a user may adjust, operate, or manage the data processing system 10. The management interface 30 may be implemented as any one type of compute device including a computer, a multiprocessor system, a server, a rack-mount server, a board server, a laptop computer, a notebook computer, a tablet computer, a wearable computing system, a network device, a web device, a distributed computing system, a processor-based system, and/or a consumer electronic device.

In various embodiments, the management interface 30 may be implemented by a distributed system having compute functions executable by the computing racks 20 or user interface functions executable by the management interface 30. In other embodiments, the management interface 30 may be implemented by a virtual server that is configured by distributed multiple computing systems through the network 40 and operates as a cloud. The management interface 30 may include a processor, an input/output sub-system, a memory, a data storage device, and a communication circuit.

The network 40 may perform data transmission and/or reception between the computing racks 20 and the management interface 30 and/or among the computing racks 20. The network 40 may be implemented by a predetermined number of various wired and/or wireless networks. For example, the network 40 may be implemented by a wired or wireless local area network (LAN), a wide area network (WAN) cellular network, and/or a publicly-accessible global network such as the internet, or may include these networks. In addition, the network 40 may include a predetermined number of auxiliary network devices such as auxiliary computers, routers, and switches. Furthermore, the network 40 may be electrically connected by an interface network such as cache coherent interconnect for accelerators (CCIX) and GEN-Z.

Figure 2:
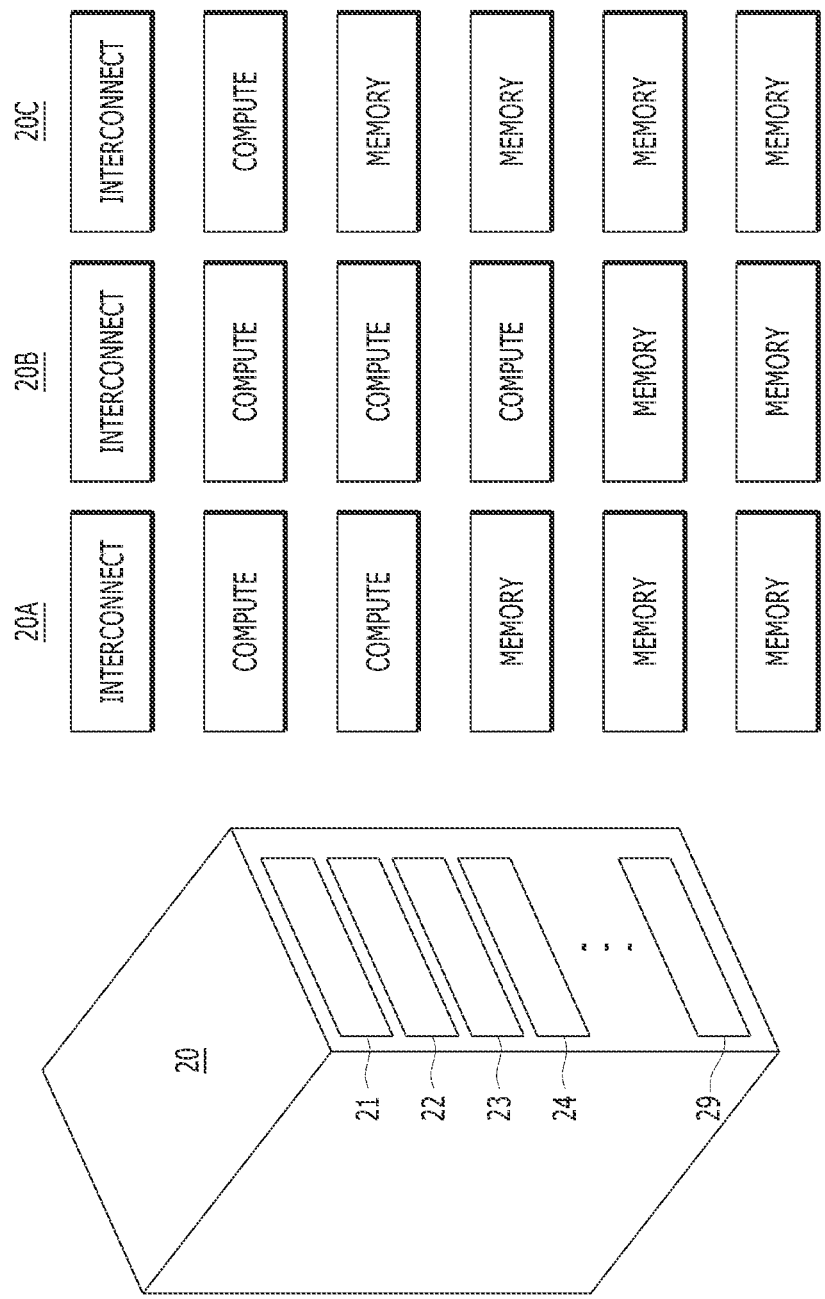
FIG. 2 is a diagram schematically illustrating an architecture of a computing rack in accordance with an embodiment.

FIG. 2 is a diagram schematically illustrating an architecture of a computing rack 20 in accordance with an embodiment. By way of example but not limitation, FIG. 2 illustrates three examples of computing racks 20: computing rack 20A, computing rack 20B, computing rack 20C.

Referring to FIG. 2, the computing rack 20 is not limited by a structure, a shape, a name, and the like of elements, and may include various types of elements depending on design. By way of example but not limitation, the computing rack 20 may include a plurality of drawers 21 to 29. Each of the plurality of drawers 21 to 29 may include a plurality of boards.

In various embodiments, the computing rack 20 may be implemented through a combination of a predetermined number of compute boards, memory boards, and/or interconnect boards. Herein, is it shown as an example that the computing rack 20 is defined to be implemented through a combination of a plurality of boards; however, it is noted that the computing rack 20 may be defined to be implemented in various other names such as drawers, modules, trays, chassis, and units, instead of boards. Elements of the computing rack 20 may have an architecture categorized and distinguished according to functions for the convenience of implementation. Although not limited thereto, the computing rack 20 may have an architecture categorized in order of the interconnect boards, the compute boards, and the memory boards from the top. Such a computing rack 20 and a computing system implemented by the computing rack 20 may be called a "rack scale system" or a "disaggregated system".

In various embodiments, the computing system may be implemented by one computing rack 20. However, the present invention is not limited thereto. For example, the computing system may be implemented by all elements included in two or more computing racks 20, a combination of some elements included in two or more computing racks 20, or some elements included in one computing rack 20.

In various embodiments, the computing system may be implemented through a combination of a predetermined number of compute boards, memory boards, and interconnect boards included in the computing rack 20. The predetermined number of compute boards, memory boards, and interconnect boards included in the computing rack 20 may vary according to the computing system design. For example, a computing system 20A may be implemented by two compute boards, three memory boards, and one interconnect board. In another example, a computing system 20B may be implemented by three compute boards, two memory boards, and one interconnect board. In yet another example, a computing system 20C may be implemented by one compute board, four memory boards, and one interconnect board.

Although FIG. 2 illustrates the case where the computing rack 20 is implemented through a combination of a predetermined number of compute boards, memory boards, and/or interconnect boards, the present invention is not limited thereto. For example, the computing rack 20 may include additional elements such as a power system, a cooling system, and input and/or output devices which may be found in a typical server and the like.

Figure 3:
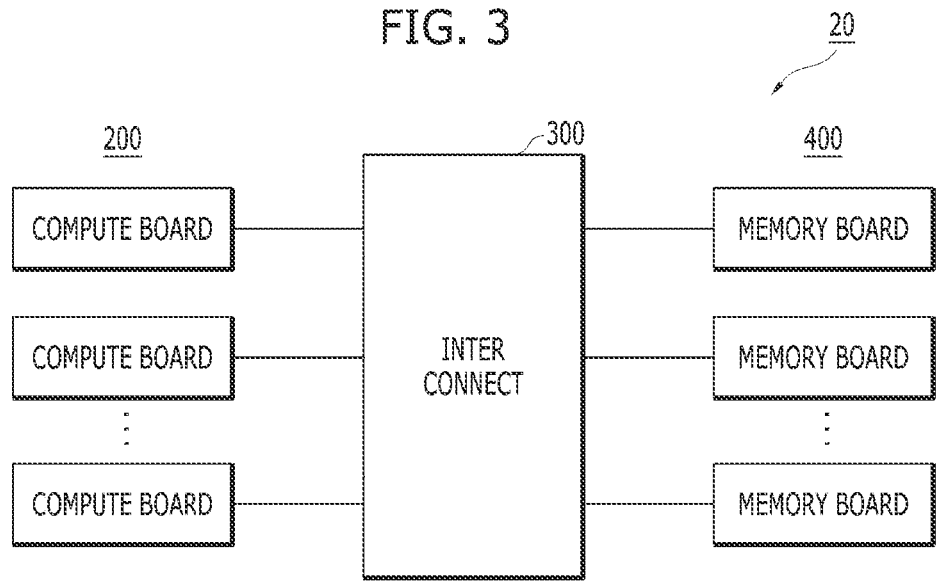
FIG. 3 is a block diagram illustrating a computing rack in accordance with an embodiment.

FIG. 3 is a diagram illustrating a computing rack 20 in accordance with an embodiment.

Referring to FIG. 3, the computing rack 20 may include a plurality of compute boards 200, a plurality of memory boards 400, and an interconnect board 300. The plurality of compute boards 200 may be called "pooled compute boards", "pooled compute systems," and the like. Similarly, the plurality of memory boards 400 may be called "pooled memory boards", "pooled memory systems, and the like. Herein, the computing rack 20 is defined to be implemented through a combination of a plurality of boards; however, it is noted that, instead, the computing rack 20 may be defined to be implemented in various other names such as drawers, modules, trays, chassis, and units.

Each of the plurality of compute boards 200 may include one or more processors, one or more processing/control circuits, or one or more processing elements such as central processing units (CPUs).

Each of the plurality of memory boards 400 may include various types of memories such as a plurality of volatile and/or nonvolatile memories. By way of example and not limitation, each of the plurality of memory boards 400 may include a plurality of dynamic random access memories (DRAMs), a plurality of flash memories, a plurality of memory cards, a plurality of hard disk drives (HDDs), a plurality of solid state drives (SSDs), and/or combinations thereof.

Each of the plurality of memory boards 400 may be divided, allocated, or designated by one or more processing elements included in each of the compute boards 200 according to the purpose of use. Furthermore, each of the plurality of memory boards 400 may store one or more operating systems (OSs) which may be initialized and/or executed by the compute boards 200.

The interconnect board 300 may be implemented by any one communication circuit and device, which may be divided, allocated, or designated by one or more processing elements included in each of the compute boards 200 for the purpose of use, or a combination thereof. For example, the interconnect board 300 may be implemented as any number of network interface ports, cards, or switches. The interconnect board 300 may use protocols for performing communication, which are related to one or more wired or wireless communication technologies. For example, the interconnect board 300 may support communication between the compute boards 200 and the memory boards 400 according to protocols such as peripheral component interconnect express (PCIe), QuickPath interconnect (QPI), and Ethernet. In addition, the interconnect board 300 may be electrically connected to the compute boards 200 by an interface standard such as cache coherent interconnect for accelerators (CCIX) and GEN-Z.

Figure 4:
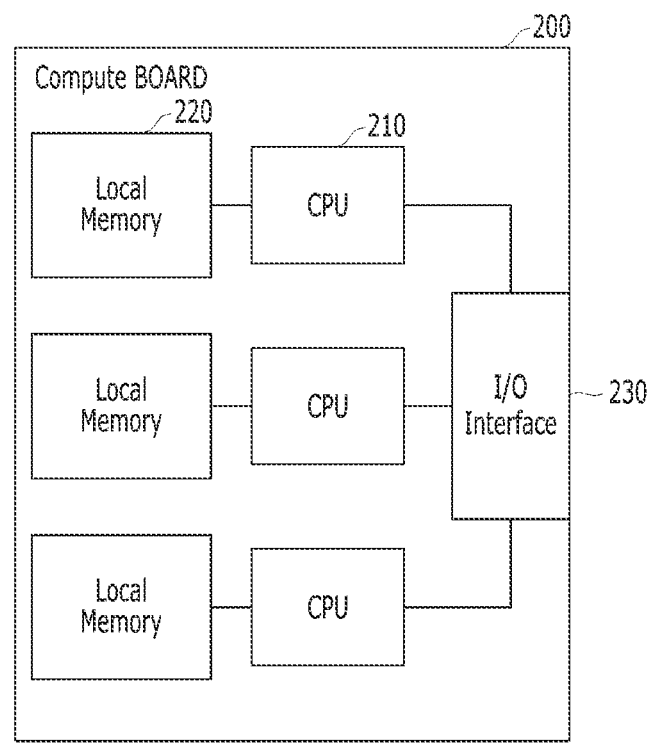
FIG. 4 is a diagram illustrating a compute board in accordance with an embodiment.

FIG. 4 is a diagram illustrating a compute board 200 in accordance with an embodiment.

Referring to FIG. 4, the compute board 200 may include one or more central processing units (CPUs) 210, one or more local memories 220, and an input/output (I/O) interface 230.

The CPU 210 may divide, allocate, or designate at least one memory board to be used among the plurality of memory boards 400 illustrated in FIG. 3. Furthermore, the CPU 210 may initialize the divided, allocated, or designated at least one memory board and perform a data read operation, write (or program) operation and the like through the at least one memory board.

The local memory 220 may store data required for performing the operations of the CPU 210. In various embodiments, one local memory 220 may have a structure corresponding to one CPU 210 in a one-to-one manner.

The I/O interface 230 may support interfacing between the CPU 210 and the memory boards 400 through the interconnect board 300 of FIG. 3. The I/O interface 230 may output transmission data to the interconnect board 300 from the CPU 210, and receive reception data to the CPU 210 from the interconnect board 300, by using protocols related to one or more wired or wireless communication technologies, and. For example, the I/O interface 230 may support communication between the CPU 210 and the interconnect board 300 according to protocols such as peripheral component interconnect express (PCIe), QuickPath interconnect (QPI), and Ethernet. In addition, the I/O interface 230 may support communication between the CPU 210 and the interconnect board 300 according to an interface standard such as cache coherent interconnect for accelerators (CCIX) and GEN-Z.

Figure 5:
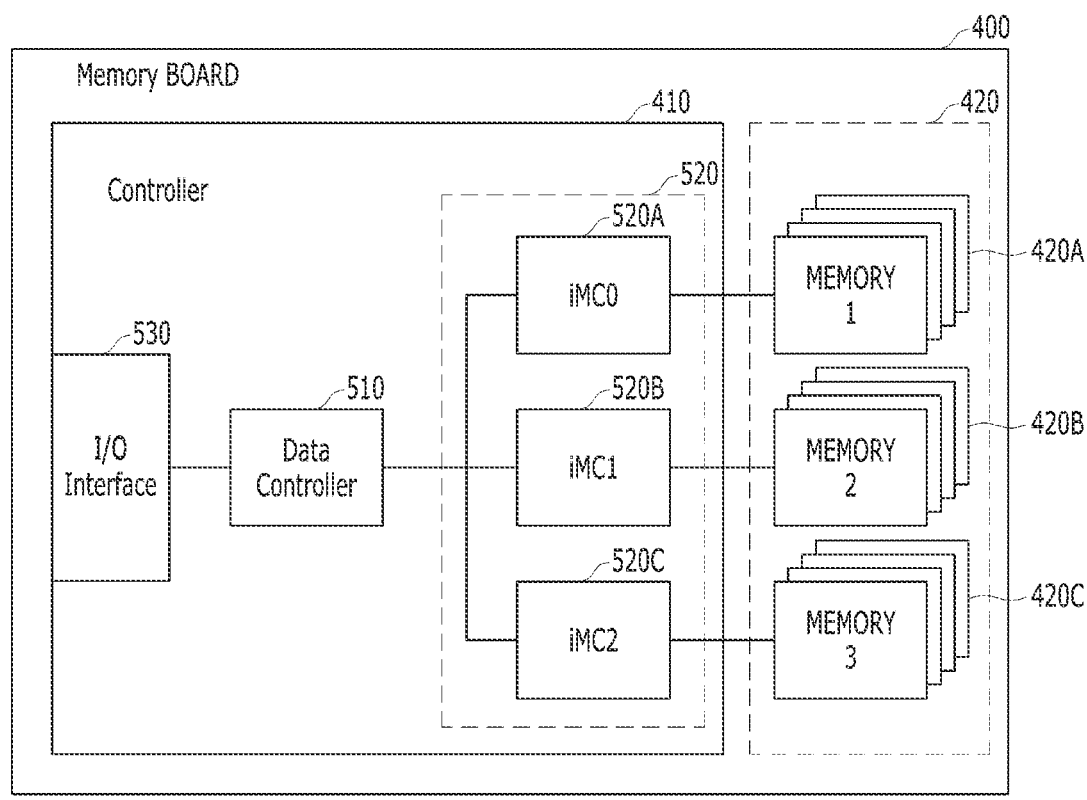
FIG. 5 is a diagram illustrating a memory board in accordance with an embodiment.

FIG. 5 is a diagram illustrating a memory board 400 in accordance with an embodiment.

Referring to FIG. 5, the memory board 400 may include a controller 410 and a plurality of memories 420. The plurality of memories 420 may store (or write) data therein and output (or read) the stored data under the control of the controller 410. The plurality of memories 420 may include a first group of memories 420A, a second group of memories 420B, and a third group of memories 420C. The first group of memories 420A, the second group of memories 420B, and the third group of memories 420C may have characteristics substantially equal to one another or may have characteristics different from one another. In various embodiments, the first group of memories 420A, the second group of memories 420B, and the third group of memories 420C may be memories having characteristics different from one another in terms of storage capacity or latency.

The controller 410 may include a data controller 510, memory controllers (MCs) 520, and an input/output (I/O) interface 530.

The data controller 510 may control data transmitted and/or received between the compute boards 200 and the plurality of memories 420. For example, in response to a write request or command, the data controller 510 may control a write operation for receiving data to be written from the compute boards 200 and writing the data in a corresponding memory of the plurality of memories 420. In another example, in response to a read request or command, the data controller 510 may control a read operation for reading data, which is stored in a specific memory of the plurality of memories 420, from the compute boards 200 and outputting the read data to a corresponding compute board of the compute boards 200.

The memory controllers 520 may be disposed between the data controller 510 and the plurality of memories 420, and may support interfacing therebetween. The memory controllers 520 may include a first memory controller (iMC0) 520A, a second memory controller (iMC1) 520B, and a third memory controller (iMC2) 520C respectively corresponding to the first group of memories 420A, the second group of memories 420B, and the third group of memories 420C included in the plurality of memories 420. The memory controller (iMC0) 520A may be disposed between the data controller 510 and the first group of memories 420A, and may support data transmission/reception therebetween. The memory controller (iMC1) 520B may be disposed between the data controller 510 and the second group of memories 420B, and may support data transmission/reception therebetween. The memory controller (iMC2) 520C may be disposed between the data controller 510 and the third group of memories 420C, and may support data transmission/reception therebetween. For example, when the third group of memories 420C are flash memories, the memory controller (iMC2) 520C may be a flash controller. The first to third group of memories 420A to 420C are for illustrative purposes only and the embodiment is not limited thereto.

The I/O interface 530 may support interfacing between the data controller 510 and the compute boards 200 through the interconnect board 300 of FIG. 3. The I/O interface 530 may output transmission data to the interconnect board 300 from the data controller 510 and receive reception data to the data controller 510 from the interconnect board 300 by using protocols related to one or more wired or wireless communication technologies. For example, the I/O interface 530 may support communication between the data controller 510 and the interconnect board 300 according to protocols such as peripheral component interconnect express (PCIe), QuickPath interconnect (QPI), and Ethernet. In addition, the I/O interface 530 may support communication between the data controller 510 and the interconnect board 300 according to an interface standard such as cache coherent interconnect for accelerators (CCIX) and GEN-Z.

As described above, a server system or a data processing system such as a future data center may have an architecture in which a plurality of boards including compute boards, memory boards, storage boards and the like are distinctively mounted in a unit rack. In this case, one memory board may include a plurality of memories having characteristics different from one another in order to satisfy various user workloads. That is, one memory board may be a convergence memory device in which a plurality of memories such as DRAMs, PCRAMs, MRAMs, STT-RAMs, and flash memories are converged. In such a convergence memory device, since the memories characteristics different from one another, it may be utilized for various usage models.

Hereinafter, with reference to FIG. 6A to FIG. 6C, FIG. 7A and FIG. 7B, and FIG. 8, a data processing system capable of collecting and analyzing error information on data stored in a memory device and an operating method thereof will be described in more detail.

Figure 6A:
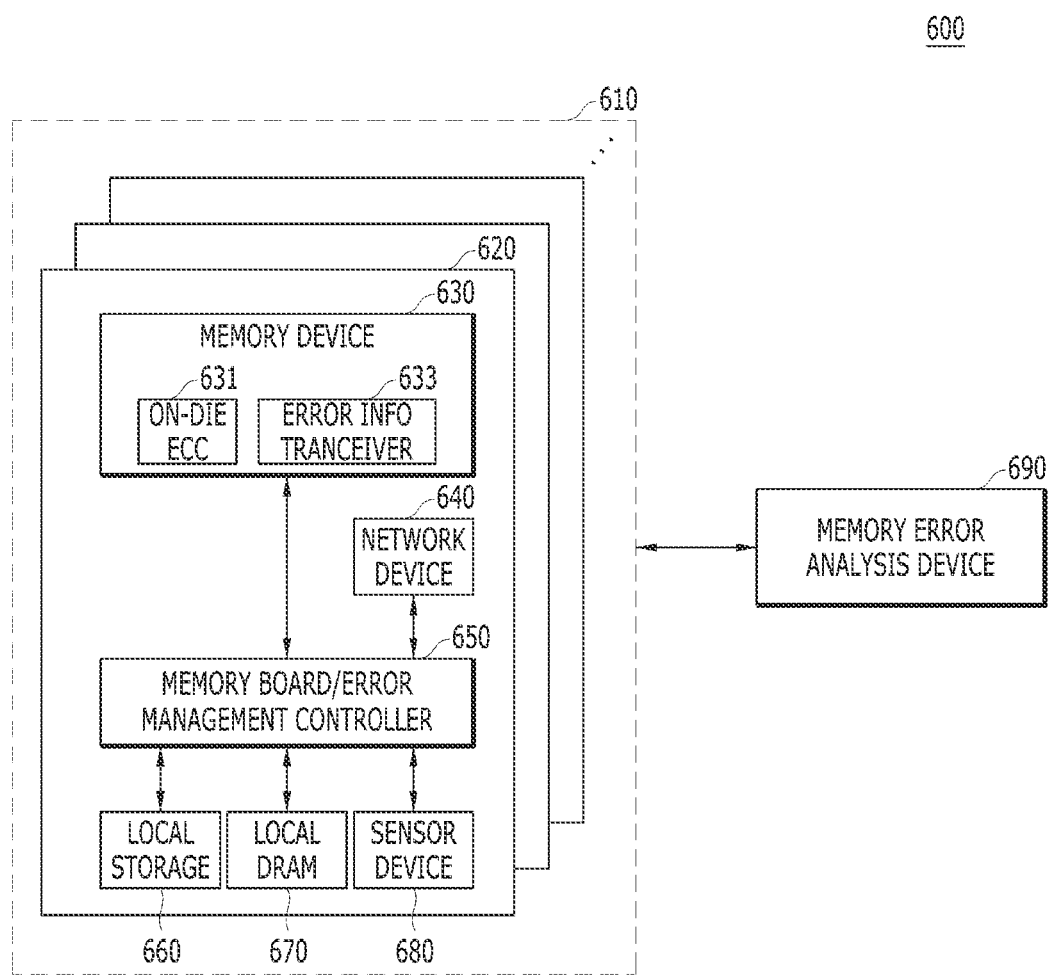
FIG. 6A is a diagram illustrating a data processing system in accordance with an embodiment.

FIG. 6A illustrates a data processing system 600 for analyzing a memory error in accordance with an embodiment. Referring to FIG. 6A, the data processing system 600 may include a memory board set 610 and a memory error analysis device 690.

The memory board set 610 may include a plurality of memory boards 620. The present disclosure describes a single memory board set 610 by way of example and for convenience; however, the memory board set 610 may include a plurality of memory board sets. The memory board set 610 may correspond to the plurality of memory boards 400 described with reference to FIG. 5.

The memory board 620 may include a plurality of memory devices 630, a local storage 660, a local dynamic random access memory (DRAM) 670, a sensor device 680, a network device 640, and an error management controller 650.

The memory device 630 may be defined as a storage device that stores data. The memory device 630 will be described as a single memory device for convenience; however, the memory board 620 may include two or more memory devices 630.

For example, the memory device 630 may be defined as a set of single NAND flash memory. Furthermore, the memory device 630 may also be defined as a set of a plurality of nonvolatile memories such as NAND flash memories, a plurality of volatile memories such as DRAMs, or memory products in which memory devices different from one another and different types of memories are provided inclusive of high capacity storages. That is, the scope of the present invention should be interpreted regardless of the type and number of memories constituting the memory device 630.

Each of the memory devices 630 may include an on-die error correction code (ECC) circuit 631 and an error information transceiver 633.

The on-die ECC circuit 631 may correct an error of data stored in the memory device 630. A method, in which the on-die ECC circuit 631 corrects an error of data stored in the memory device 630, may be performed by various ECC algorithms including a Hamming code and the like. In accordance with an embodiment, the on-die ECC circuit 631 included in each of the memory devices 630 may generate first error information.

In an embodiment, the on-die ECC circuit 631 may generate the first error information in a predetermined format.

In accordance with an embodiment, the memory board 620 may include an error management controller 650 that collects and categorizes the first error information received from each of the memory devices 630. Therefore, the error management controller 650 may increase reliability of the memory board 620 by using the collected first error information.

The error information transceiver 633 may receive the error information from the on-die ECC circuit 631 and transmit the error information to the error management controller 650.

In this case, the memory device 630 may include the local storage 660 and the local DRAM 670, that is, the memory device 630 may be a device that stores data.

That is, if the local storage 660 and the local DRAM 670 is included in the memory device 630, the on-die ECC circuit 631 of the memory device 630 may correct an error of data stored in the local storage 660 and the local DRAM 670. Furthermore, the memory device 630 may transmit error information on data stored in the local storage 660 and the local DRAM 670 to the error management controller 650 through the error information transceiver 633.

In addition to the local storage 660 and the local DRAM 670, all devices capable of storing data may be included in the memory device 630.

The error management controller 650 may collect the first error information through the on-die ECC 631 circuit included in each of the memory devices 630. Furthermore, the error management controller 650 may control the local storage 660, the local DRAM 670, the sensor device 680, and a display device (not illustrated).

The local storage 660 may perform storing the first error information output from the error management controller 650. As described above, the local storage 660 may be included in the memory device 630.

The local DRAM 670 may temporarily store data related to the memory board 620. As described above, the local DRAM 670 may be included in the memory device 630.

The sensor device 680 may include at least one sensing device capable of sensing the state of the memory board 620. In an embodiment, the sensor device 680 may sense the temperature of the memory board 620 and operate a cooling system (not illustrated) according to the temperature.

The on-die ECC circuit 631 may correct an error of data stored in the memory device 630. The error management controller 650 may receive the first error information generated by the on-die ECC circuit 631 through the error information transceiver 633.

The first error information generated by the on-die ECC circuit 631 may include error details such as a type of a memory in which the error has occurred, a manufacturing company of the memory in which the error has occurred, an address of the memory in which the error has occurred, a temperature of a memory board when the error has occurred, and whether the error is a correctable error.

In an embodiment, the address of the memory is raw address of the memory board 620.

In an embodiment, the address of the memory is system address of compute board 200.

The error management controller 650 may categorize the first error information generated by the on-die ECC circuit 631 according to an error categorization criterion, and manage the categorized error information. For example, the error management controller 650 may categorize the first error information according to the error categorization criterion such as an error occurrence position, and a temperature of a memory board when an error has occurred, and manage the categorized error.

Furthermore, the error management controller 650 may collect not only the first error information on the data stored in the memory device 630, but also information on an error occurred in other data storage device (e.g. the local storage 660, the local DRAM 670 and the like) included in the memory board 620.

The error management controller 650 extract error details from the first error information, and organize the error details to generate second error information.

The network device 640 may transmit the second error information to the memory error analysis device 690.

The network device 640 may communicate with the memory error analysis device 690 through a wired and/or wireless communication device. Such a wired and/or wireless communication device may include all communication devices that transmit data.

The network device 640 may operate similarly to the function of the I/O interface 530 described with reference to FIG. 5.

Specifically, the network device 640 may output transmission data to the memory error analysis device 690 from the error management controller 650 and receive reception data to the error management controller 650 from the memory error analysis device 690 by using protocols related to one or more wired or wireless communication technologies.

For example, the network device 640 may support communication between the error management controller 650 and the memory error analysis device 690 according to protocols such as peripheral component interconnect express (PCIe), QuickPath interconnect (QPI), and Ethernet.

In addition, the network device 640 may support communication between the error management controller 650 and the memory error analysis device 690 according to an interface standard such as cache coherent interconnect for accelerators (CCIX) and GEN-Z.

The memory error analysis device 690 may receive the second error information on each of the memory boards 620 included in the memory board set 610, which is generated by the error management controller 650, and analyze the second error information.

Furthermore, the memory error analysis device 690 may analyze the second error information.

The error management controller 650 may manage the operation of the memory board 620. Also, the error management controller 650 may manage an error occurring in the memory device 630. Furthermore, the error management controller 650 may manage all operations of devices related to the basic operation of the memory board 620.

For example, the memory board 620 may include a cooler or cooling system (not illustrated) capable of adjusting the temperature of the memory board 620. The error management controller 650 may adjust the temperature of the memory board 620 by using the cooler.

Furthermore, the memory board 620 may include a display device (not illustrated) capable of performing substantially the same role as that of a display device 655 included in the error management controller 650, as will be described in FIG. 6B later.

The error management controller 650 may visually provide information on the memory board 620 to a user through the display device 655.

Figure 6B:
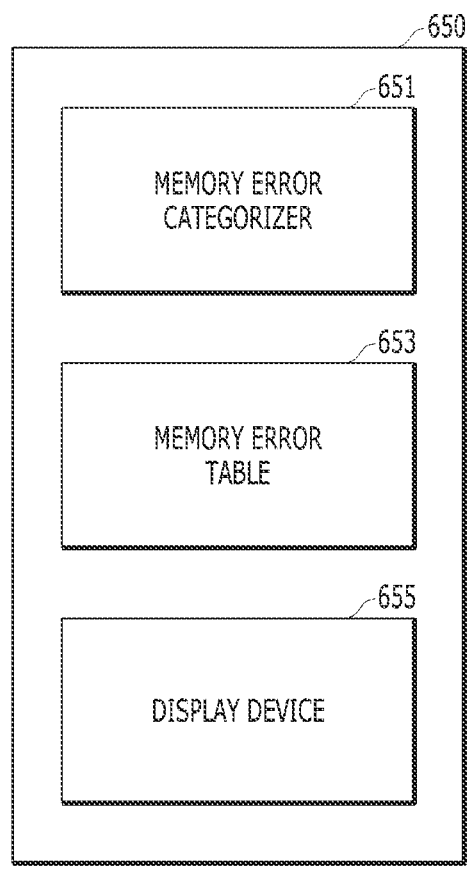
FIG. 6B is a diagram illustrating an error management controller in accordance with an embodiment.

FIG. 6B illustrates the error management controller 650 in accordance with an embodiment. Referring to FIG. 6B, the error management controller 650 may include a memory error categorizer 651, a memory error table 653, and the display device 655.

The memory error categorizer 651 may receive the first error information, extract error details constituting the first error information, and categorize the error details. In various embodiments, the memory error categorizer 651 may categorize the error details according to at least one error categorization criterion through a parsing operation for extracting only error details required for a user from a plurality of error details constituting the error information.

The error information may include the information on an error occurred in the data storage device included in the memory board 620, as well as the first error information on the data stored in the memory device 630. For example, the error information may indicate information on an error occurring in all the sub-storage devices (e.g., the local storage 660, the local DRAM 670 and the like) capable of constituting the memory board 620.

The error categorization criterion, for example, may include a type of a memory in which an error has occurred, an error count occurred in one memory, a manufacturing company of the memory in which the error has occurred, an address of the memory in which the error has occurred, a temperature of a memory board when the error has occurred, or whether the error is a correctable error. Such an error categorization criterion is not limited to the aforementioned example and may include any and all various error categorization criterions according to error details constituting error information.

In accordance with an embodiment, the memory error categorizer 651 may operate according to at least one error categorization criterion. For example, the memory error categorizer 651 may extract at least one error details from the first error information according to the error categorization criterion.

When the memory error categorizer 651 operates according to the type of the memory in which an error has occurred, the memory error categorizer 651 may extract information on the type of the memory from a plurality of error details constituting the error information through the parsing operation, and store the extracted information in the memory error table 653. The display device 655 may display the error information stored in the memory error table 653.

When the memory error categorizer 651 operates according to the address of the memory in which the error has occurred, the memory error categorizer 651 may extract information on the address of the memory from the plurality of error details constituting the error information through the parsing operation, and store the extracted information in the memory error table 653. The display device 655 may display the error information stored in the memory error table 653.

When the memory error categorizer 651 operates according to the temperature of the memory board when the error has occurred, the memory error categorizer 651 may extract information on the temperature of the memory board from the plurality of error details constituting the error information through the parsing operation, and store the extracted information in the memory error table 653. The display device 655 may display the error information stored in the memory error table 653.

When the memory error categorizer 651 operates according to whether the error is a correctable error, the memory error categorizer 651 may extract information indicating whether the error is a correctable error from the plurality of error details constituting the error information through the parsing operation, and store the extracted information in the memory error table 653. The display device 655 may display the error information stored in the memory error table 653.

In addition to the aforementioned example, the memory error categorizer 651 may extract information corresponding to a criterion set by a user from the plurality of error details constituting the error information through the parsing operation according to the criterion set by the user, and store the extracted information in the memory error table 653. The display device 655 may display the error information stored in the memory error table 653.

Furthermore, the memory error categorizer 651 may also categorize the error details by a plurality of error categorization criterions set by a user. For example, the memory error categorizer 651 may set "whether the error is a correctable error" and "the temperature of the memory board when the error has occurred" as the error categorization criterion. The memory error categorizer 651 may categorize the error details received therein as a correctable error and a non-correctable error according to whether the error is a correctable error. The memory error categorizer 651 may additionally parse error count information only for the correctable error and store the information in the memory error table 653.

Figure 6C:
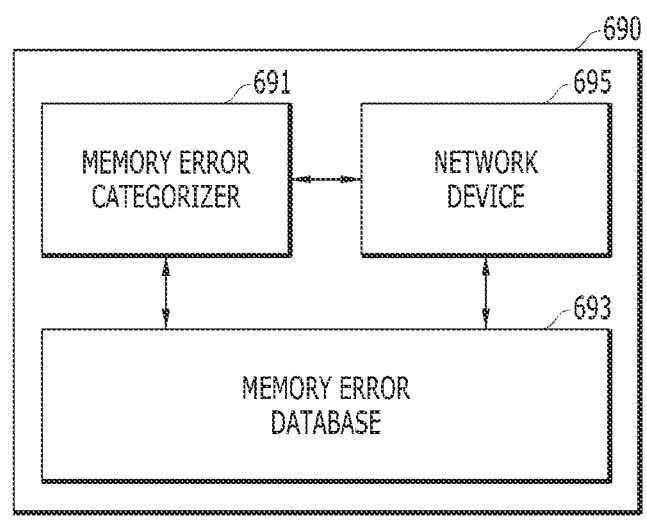
FIG. 6C is a diagram illustrating a memory error analysis device in accordance with an embodiment.

FIG. 6C illustrates a memory error analysis device 690 in accordance with an embodiment.

Referring to FIG. 6C, the memory error analysis device 690 may include a memory error categorizer 691, a memory error database 693, and a network device 695. In an embodiment, the memory error analysis device 690 may included in the compute board 200 described with reference to FIG. 4.

The memory error analysis device 690 may operate based on Hadoop® which is a Java-based software framework that supports a distributed application operating in a large-scale computer cluster capable of processing mass material. The Hadoop® is just one example capable of implementing the memory error analysis device 690. All platforms capable of implementing the memory error analysis device 690 including Hadoop® may be applied to the present invention. In other words, it is noted that the scope of the present invention is not limited to a memory error analysis device based on Hadoop®.

The memory error analysis device 690 may receive the second error information from a data system 600 including the plurality of memory boards 620 through the network device 695, and analyze the second error information.

The memory error categorizer 691 may receive the second error information from the memory boards 620, extract error details constituting the second error information, and categorize the error details according to an error categorization criterion, similar to the operation of the memory error categorizer 651 described with reference to FIG. 6B. And the memory error categorizer 691 may analyze the categorized error details.

The error information may include the information on an error occurred in the data storage device included in the memory board 620, as well as the error information on the data stored in the memory device 630. For example, the error information may indicate information on an error occurring in all the sub-storage devices (e.g., the local storage 660, the local DRAM 670 and the like) capable of constituting the memory board 620.

In various embodiments, the memory error categorizer 691 may categorize the detailed error information according to the at least one error categorization criterion. For example, the memory error categorizer 691 may categorize the error details through a parsing operation for extracting only error details required for a user of the data processing system 600 from a plurality of error details constituting the error information.

In an embodiment, the memory error categorizer 691 may operate according to at least one error categorization criterion. For example, the memory error categorizer 691 may extract at least one error details corresponding the error categorization criterion, from the second error information received from the at least one memory board 620.

The error categorization criterion, for example, may be one of a type of a memory in which an error has occurred, a manufacturing company of the memory in which the error has occurred, an address of the memory in which the error has occurred, a temperature of a memory board when the error has occurred, or whether the error is a correctable error. Such an error categorization criterion is not limited to the aforementioned example and may include any and all various error categorization criterions according to error details constituting error information.

When the memory error categorizer 691 operates according to the type of the memory in which an error has occurred, the memory error categorizer 691 may extract information on the type of the memory from a plurality of error details constituting the error information through the parsing operation, and store the extracted information in the memory error database 693. When the memory error categorizer 691 operates according to the error count occurred in one memory, the memory error categorizer 691 may extract error count information from the plurality of error details constituting the error information through the parsing operation, and store the extracted information in the memory error database 693.

When the memory error categorizer 691 operates according to the address of the memory in which the error has occurred, the memory error categorizer 691 may extract information on the address of the memory from the plurality of error details constituting the error information through the parsing operation, and store the extracted information in the memory error database 693.

When the memory error categorizer 691 operates according to the temperature of the memory board when the error has occurred, the memory error categorizer 691 may extract information on the temperature of the memory board from the plurality of error details constituting the error information through the parsing operation, and store the extracted information in the memory error database 693.

In addition to the aforementioned example, the memory error categorizer 691 may extract error details corresponding to the at least one error categorization criterion set by a user from the second error information through the parsing operation. And the memory error categorizer 691 may store the error details in the memory error database 693.

The network device 695 may receive the second error information through the network device 640 of each of the memory boards 620.

The network device 695 may communicate with the network device 640 of each of the memory boards 620 through a wired and/or wireless communication device. Such a wired and/or wireless communication device may include all communication devices that transmit data.

The network device 695 may operate similarly to the function of the I/O interface 530 described with reference to FIG. 5.

Specifically, the network device 695 may output transmission data to the error management controller 650 from the memory error analysis device 690. Also, the network device 695 may receive reception data to the memory error analysis device 690 from the error management controller 650. The network device 695 may output transmission data and receive reception data by using protocols related to one or more wired or wireless communication technologies.

For example, the network device 695 may support communication between the error management controller 650 and the memory error analysis device 690 according to protocols such as peripheral component interconnect express (PCIe), QuickPath interconnect (QPI), and Ethernet.

In addition, the network device 695 may support communication between the error management controller 650 and the memory error analysis device 690 according to an interface standard such as cache coherent interconnect for accelerators (CCIX) and GEN-Z.

Figure 7A:
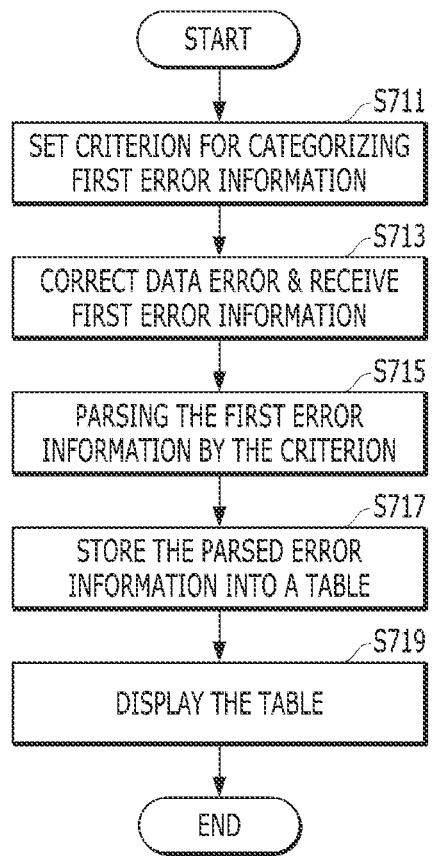
FIGS. 7A and 7B are flowcharts illustrating operations of a memory error management device in accordance with an embodiment.

FIG. 7A is a flowchart illustrating the operating process of the error management controller 650 as described with reference to FIGS. 6A to 6C.

At step S711, at least one error categorization criterion may be set. The memory error categorizer 651 included in the error management controller 650 may operate according to the error categorization criterion.

At step S713, the on-die ECC circuit 631 may correct an error of data stored in the memory device 630. And the on-die ECC circuit 631 may generate the first error information including error details. The error management controller 650 may receive the first error information.

At step S715, the memory error categorizer 651 may parse the first error information by the error categorization criterion. Specifically, the memory error categorizer 651 may parse the first error information. And the memory error categorizer 651 may extract at least one error details from the parsed error information corresponding to the error categorization criterion.

At step S717, the memory error categorizer 651 may store the error details in the memory error table 653.

In an embodiment, the memory error categorizer 651 may categorize the error details according to the error categorization criterion and store the error details in the memory error table 653.

In an embodiment, the memory error categorizer 651 may generate second error information by organizing the error details. And the memory error categorizer 651 may transmit the second error information to the memory error analysis device 690.

At step S719, the display device 655 may display the error details stored in the memory error table 653.

In an embodiment, the memory error categorizer 651 may count the error number of the respective memory devices 630 based on error details on the address of the memory in which the error has occurred. And the memory error categorizer 651 may detect whether one among the error numbers exceeds a threshold value. And the memory error categorizer 651 may control the display device 655 to display a signal to inform the user to replace the memory device 630.

Meanwhile, if the error of data stored in the memory device 630 is uncorrectable error, the uncorrectable error causes failure of the memory device 630. Therefore, if an uncorrectable error occurs, it may be necessary to shut down the memory board 620 and replace the memory device 630.

Figure 7B:
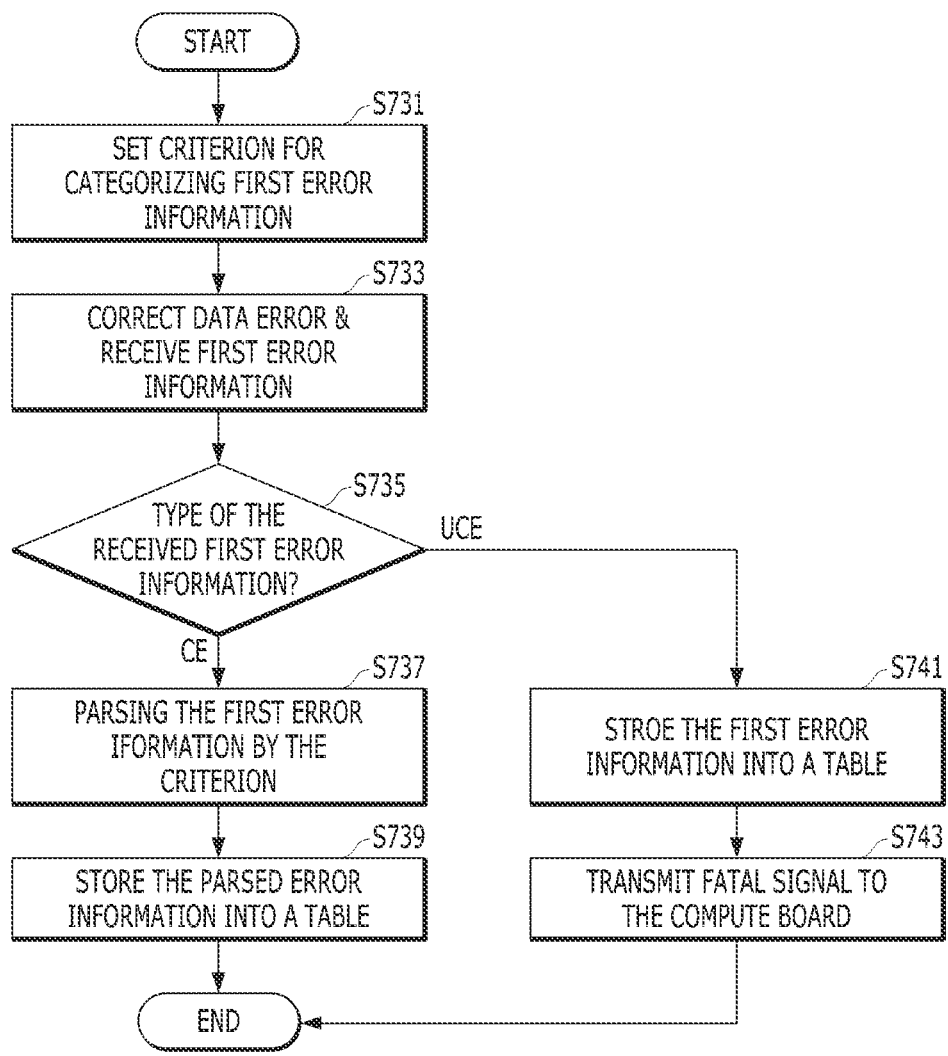

FIG. 7B is a flowchart illustrating the operating process of the error management controller 650 with reference to FIGS. 6A to 6C.

At step S731, at least one of error categorization criterion may be set. The memory error categorizer 651 included in the error management controller 650 may operate according to the the error categorization criterion.

At step S733, the on-die ECC circuit 631 may correct an error of data stored in the memory device 630. And the on-die ECC circuit 631 may generate different type of first error information according to whether the error is a correctable error. The error management controller 650 may receive first error information on the data in which the error has occurred.

At step S735, the memory error categorizer 651 may determine the type of the first error information.

When the first error information is correctable error information ('CE' at the step S735), the memory categorizer 651 may parse the first error information by the error categorization criterion at step S737. Specifically, the memory error categorizer 651 may parse the first error information. And the memory error categorizer 651 may extract at least one error details from the parsed error information corresponding to the error categorization criterion.

At step S739, the memory error categorizer 651 may store the error details in the memory error table 653.

When the first error information is uncorrectable error information ('UCE' at the step S735), the memory error categorizer 651 may store the first error information at step S741.

In an embodiment, the data processing system 600 may include the compute board 200 described with reference to FIG. 4.

At step S743, the memory error categorizer 651 may transmit fatal signal to the compute board 200. In response to a fatal signal, the compute board 200 may shut down the memory board 620.

In an embodiment, the memory error categorizer 651 may parse the first error information after the memory board 620 booted up.

Figure 8:
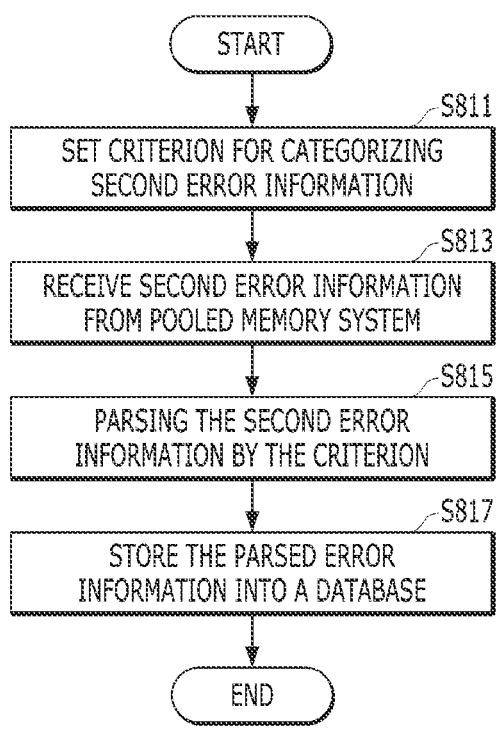
FIG. 8 is a flowchart illustrating an operation of a memory error analysis device in accordance with an embodiment.

FIG. 8 is a flowchart illustrating the operating process of the memory error analysis device 690 as described with reference to FIGS. 6A to 6C.

The memory error analysis device 690 may operate based on Hadoop® which is a Java-based software framework that supports a distributed application operating in a large-scale computer cluster capable of processing mass material. Hadoop® is just one example capable of implementing the memory error analysis device 690. All platforms capable of implementing the memory error analysis device 690, including Hadoop®, may be applied to the present invention. In other words, it is noted that the scope of the present invention is not limited to a memory error analysis device based on Hadoop®.

At step S811, at least one error categorization criterion may be set. The memory error categorizer 691 included in the memory error analysis device 690 may operate according to the error categorization criterion. Specifically, the error categorization criterion may be set by a user of the memory error analysis device 690. Alternatively, the error categorization criterion may be set by the data processing system 600 in advance in correspondence to a predetermined criterion and operation environment.

At step S813, the memory error analysis device 690 may receive second error information from the memory board set 610 of the pooled memory system. Specifically, the network device 695 of the memory error analysis device 690 may receive the second error information through the network device 640 of each of the memory boards 620.

At step S815, the memory error categorizer 691 may parse the second error information by the error categorization criterion. Specifically, the memory error categorizer 691 may parse the second error information. And the memory error categorizer 691 may extract at least one error details from the parsed error information corresponding to the set error categorization criterion. Then, the memory error categorizer 691 may categorize the error details according to the error categorization criterion.

At step S817, the memory error categorizer 691 may store the categorized error information in the memory error database 693.

In an embodiment, the memory error categorizer 691 may analyze the error details stored in the memory error database 693 by using a MapReduce framework. Specifically, the memory error categorizer 691 may filter and sort the error details. And the memory error categorizer 691 may summarize the sorted error details. Therefore, the memory error categorizer 691 may use the summarized error information for improve reliability of the data processing system 600.

In accordance with an embodiment described with references to FIGS. 6A to 6C, FIGS. 7A and 7B, and FIG. 8, it is possible to collect the first error information on an error of data stored in the memory devices 630, and extract and categorize error details from information constituting the first error information.

Furthermore, in accordance with an embodiment, it is possible to collect the second error information from the memory board set 610, and extract, categorize and analyze the error details from information constituting the second error information.

Hereinafter, with reference to FIGS. 9 to 13, a data processing system capable of acquiring characteristic data from the memory devices, setting operation modes of the memory devices and performing memory training based on the characteristic data and an operating method thereof will be described in more detail.

Figure 9:
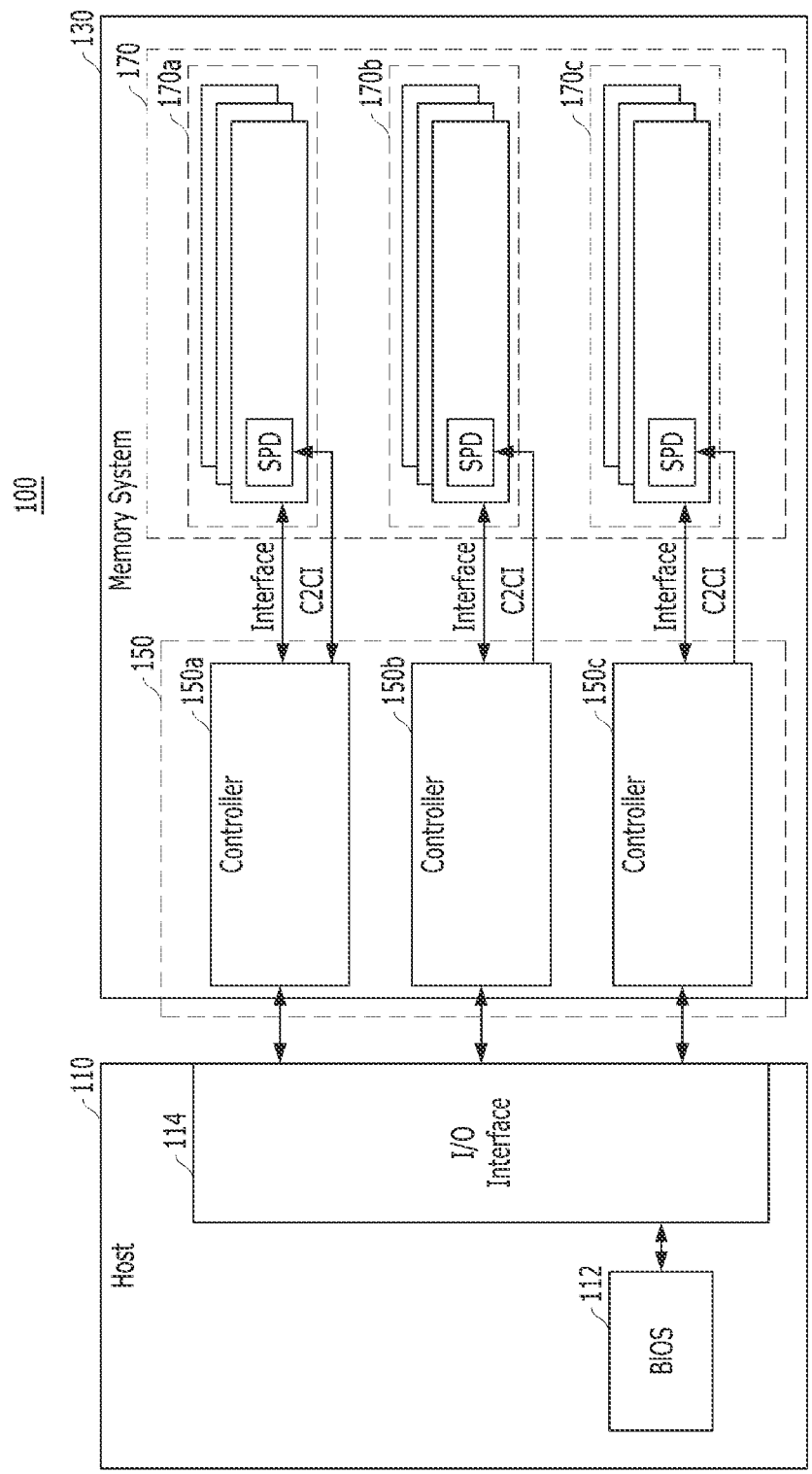
FIG. 9 illustrates a structure of a data processing system in accordance with an embodiment.

FIG. 9 illustrates a structure of a data processing system 100 in accordance with an embodiment.

Referring to FIG. 9, the data processing system 100 may include a host 110 and a memory system 130.

The host 110 may include a basic input and output (input/output) system (BIOS) 112 and an input/output (I/O) interface 114. The host 110 may correspond to the compute board 200 described with reference to FIG. 4.

The BIOS 112 may sense a peripheral device coupled to the host 110 when power is supplied to the data processing system 100.

The I/O interface 114 may support interfacing between the host 110 and the memory system 130. The I/O interface 114 may output data provided from the host 110 to the memory system 130 and input data received from the memory system 130 to the host 110, using protocols related to one or more wired or wireless communication techniques. For example, the I/O interface 114 may support communication between the host 110 and the memory system 130 according to any of various protocols, such as Peripheral Component Interconnect Express (PCIe), QuickPath Interconnect (QPI) and/or Ethernet. For another example, the I/O interface 114 may support communication between the host 110 and the memory system 130 according to any of various interface specifications, such as Cache Coherent Interconnect for accelerators (CCIX) and/or GEN-Z. The I/O interface 114 may be implemented as I/O ports, processing resources and memory resources which are included in the host 110.

The memory system 130 may include a memory pool 170 including a plurality of memory units and a controller group 150 including one or more controllers for controlling the memory pool 170. The memory system 130 may correspond to each of the memory boards 400 described with reference to FIG. 5.

In an embodiment, the memory system 130 may include memory units having different characteristics in order to satisfy various user workloads. That is, one memory system 130 may be a convergence memory device in which a plurality of memories such as a dynamic random access memory (DRAM), a phase change RAM (PCRAM), a magnetic RAM (MRAM), a spin-transfer torque RAM (STT-RAM) and a flash memory are converged. Such a convergence memory device may be utilized for various usage models because the respective memories have different characteristics.

In an embodiment, the plurality of memory units in the memory pool 170 may be grouped by the same kind of memory units. FIG. 9 exemplifies the case in which the plurality of memory units are grouped into a first memory group 170a, a second memory group 170b and a third memory group 170c. The first memory group 170a may contain memory units of a first kind, the second memory group 170b may contain memory units of a second kind, and the third memory group 170c may contain memory units of a third kind, where the first, second and third kinds may be different.

Each of the memory units may include a serial presence detect (SPD) component. The SPD component in each of the memory units may store information such as the type of the corresponding memory unit. Further, the SPD component may store information such as the types, operation timing information, capacity information and manufacturing information of memory devices in the memory unit. Even when power supply to the memory system 130 is cut off, the SPD component needs to retain the data stored therein. Therefore, the SPD component may be configured as a nonvolatile memory device, for example, an electrically erasable programmable read-only memory (EEPROM).

One or more controllers may control data communication between the host 110 and the memory units which are electrically coupled thereto. Each of the controllers may include a processor, a memory, and I/O ports. The processor may be implemented as a microprocessor or a central processing unit (CPU). The memory may serve as a working memory of the controller, and store data for driving the controller.

In an embodiment, the plurality of memory units may be electrically coupled to one controller. For example, a first controller 150a may be coupled to the memory units of the first memory group 170a. The first controller 150a may control data communication between the host 110 and the memory units of the first memory group 170a. Similarly, a second controller 150b may control data communication between the host 110 and the memory units of the second memory group 170b, and a third controller 150c may control data communication between the host 110 and the memory units of the third memory group 170c.

The BIOS 112 of the host 110 may sense the memory system 130, and perform interface training such as clock training of the I/O interface 114.

In accordance with an embodiment, the one or more controllers of the controller group 150 in the memory system 130 may sense the plurality of memory units in the memory pool 170, set operation modes of the memory units, and perform memory training, thereby reducing the processing burden of the host 110. Furthermore, while the one or more controllers sense the plurality of memory units, set the operation modes of the memory units, and perform memory training, the BIOS 112 may perform another booting operation, thereby improving the booting performance of the data processing system 100.

Since the controllers are operated in parallel to acquire characteristic data of different memory groups, respectively, and perform memory training, the booting time of the data processing system 100 may be shortened. In addition, since each of the controllers acquires characteristic data of the same kind of memory units and performs memory training, the data processing complexity of the memory system 130 including different kinds of memory units may be reduced.

Figure 10:
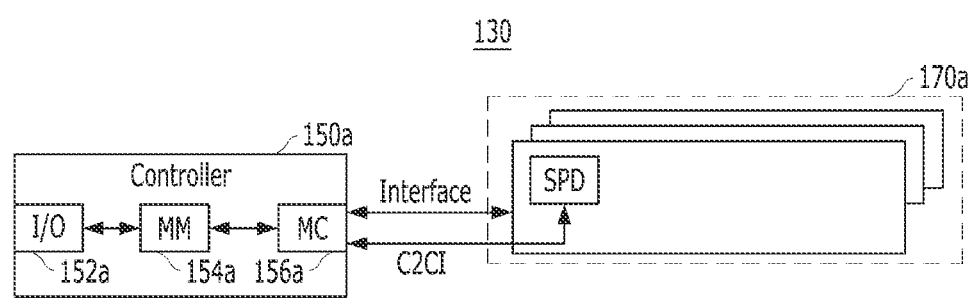
FIG. 10 illustrates a structure of a memory system in a data processing system in accordance with an embodiment.

FIG. 10 schematically illustrates a structure of the memory system 130 in the data processing system 100 in accordance with an embodiment.

FIG. 10 schematically illustrates only the first controller 150*a* in the memory system 130 and the memory units of the first memory group 170*a* coupled to the first controller 150*a*.

The first controller 150*a* may include an I/O interface 152*a*, a memory manager (MM) 154*a* and a memory controller (MC) 156*a*.

The I/O interface 152*a* may support interfacing between the host 110 and the first controller 150*a*.

The I/O interface 152*a* may provide data of the first controller 150*a* to the host 110 and provide data received from the host 110 to the MM 154*a* and the MC 156*a*, using protocols related to one or more wired or wireless communication techniques. For example, the I/O interface 152*a* may support communication between the host 110 and the first controller 150*a* according to any of various protocols, such as PCIe, QPI and Ethernet. Furthermore, the I/O interface 152*a* may support communication between the host 110 and the first controller 150*a* according to interface specifications such as CCIX and GEN-Z.

The memory controller 156*a* may support interfacing between the first controller 150*a* and the memory units of the first memory group 170*a*. The memory controller 156*a* and each of the memory units of the first memory group 170*a* may be electrically coupled to an interface for exchanging commands, addresses and data. Furthermore, the memory controller 156*a* may be electrically coupled to the SPD component in each of the memory units through a chip-to-chip interface (C2CI), for example, a system management bus (SMBus), a serial peripheral interface (SPI), an inter-integrated circuit (I2C), or an improved inter-integrated circuit (I3C).

In an embodiment, the memory manager 154*a* may sense the memory units of the first memory group 170*a* by acquiring the characteristic data of the memory units from the respective SPD components through the memory controller 156*a*, when power is supplied to the memory system 130.

Based on the acquired characteristic data, the memory manager 154*a* may set the operation modes of the memory units, and perform memory training to optimize memory channels between the first controller 150*a* and the respective memory units.

For example, the memory manager 154*a* may set the operation modes of the memory units to any of various operation modes, such as burst length, burst type, column access strobe (CAS) latency, test mode and delay locked loop (DLL) reset. The memory manager 154*a* may control the memory controller 156*a* to perform write and/or read leveling, address training, and clock training.

The memory manager 154*a* may provide the acquired characteristic data to the host 110 through the I/O interface 152*a*.

The structures of the second and third controllers 150*b* and 150*c* may correspond to the structure of the first controller 150*a*.

Figure 11:
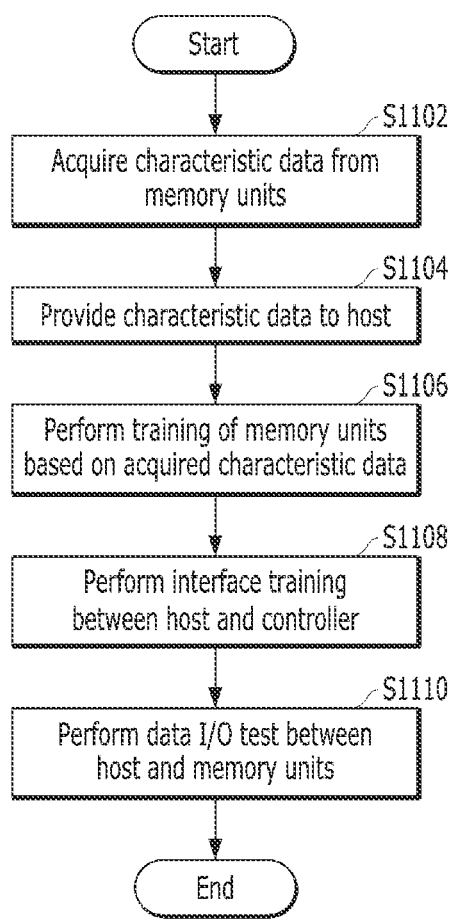
FIG. 11 is a flowchart illustrating an operation of a data processing system in accordance with an embodiment.

FIG. 11 is a flowchart illustrating an operation of the data processing system 100 in accordance with an embodiment.

Power may be supplied to the host 110 and the memory system 130 in the data processing system 100. When power is supplied to the memory system 130, the one or more controllers of the controller group 150 may acquire characteristic data from the SPD components of the memory units which are electrically coupled to the one or more controllers, through a C2CI, for example, a SMBus, SPI, I2C, I3C or the like, in step S1102.

In an embodiment, each of the one or more controllers may sense the same kind of memory units such that the memory system 130 can sense the plurality of memory units having different characteristics.

In step S1104, the one or more controllers may provide the characteristic data to the host 110.

For example, the BIOS 112 of the host 110 may sense the first controller 150*a* which is electrically coupled to the host 110. The BIOS 112 may perform initial training of the I/O interface 114 to perform data input and output with the first controller 150*a*. When the initial training is completed, the host 110 may acquire the characteristic data of the memory units of the first memory group 170*a* from the memory manager 154*a*.

That is, although the BIOS 112 does not access the SPD components of the individual memory units, the host 110 may acquire the characteristic data of the plurality of memory units from the one or more controllers, thereby acquiring information as to the types of the memory units coupled to the host 110, as well as the types, operation timing information, capacity information and manufacturing information of the memory devices in each of the memory units.

In an embodiment, the one or more controllers may provide the host 110 with the characteristic data of the memory units coupled thereto in a table format. The table format may include, as fields, the types of the memory units and the types, operation timing information, capacity information and manufacturing information of the memory devices included in each of the memory units.

In step S1106, each of the one or more controllers may set the operation modes of the memory units which are electrically coupled to thereto, based on the characteristic data acquired from the SPD components. Further, each controller may perform memory training between the controller and the corresponding memory units based on the characteristic data acquired from the SPD components.

In an embodiment, each of the one or more controllers may perform training of the same kind of memory units which are electrically coupled thereto. Thus, multiple controllers may perform training on different kinds of memory units, respectively. As a result, the memory system 130 may perform memory training of the plurality of memory units having different characteristics, which are included in the memory pool 170.

In an embodiment, the one or more controllers may store the operation mode setting data and the memory training result data, after the training is ended. An embodiment in which the memory manager 154*a* stores the operation mode setting data and the memory training result data is described in more detail with reference to FIGS. 12 and 13.

In step S1108, the host 110 may perform fine training of the I/O interface 114, i.e., interface training.

For example, the host 110 may finely adjust a clock of the I/O interface 114 in order to perform data input and output (I/O) operations with the memory units of the first memory group 170*a* through the I/O interface 152*a* of the first controller 150*a*.

When the one or more controllers complete memory training with the memory units electrically coupled thereto and the host 110 completes training of the I/O interface 114, the host 110 may perform data I/O operations on each of the memory units of the memory pool 170. Therefore, the BIOS 112 may not perform memory training of each of the memory units.

In step S1110, the host 110 may provide read and write commands to the plurality of memory units, in order to test data I/O operations between the host 110 and the memory units.

When steps S1102 to S1110 are completed, the host 110 may allocate one or more memory units of the plurality of memory units based on the characteristic data received from the one or more controllers. Further, the host 110 may store data in the allocated one or more memory units.

In accordance with the present embodiment, it is possible to reduce the processing burden of the host 110 during a booting operation of the data processing system 100. Furthermore, while the one or more controllers of the controller group 150 sense the plurality of memory units of the memory pool 170, set the operation modes of the memory units, and perform memory training, the host 110 may perform another booting operation. Therefore, the booting time of the data processing system 100 may be shortened.

Figure 12:
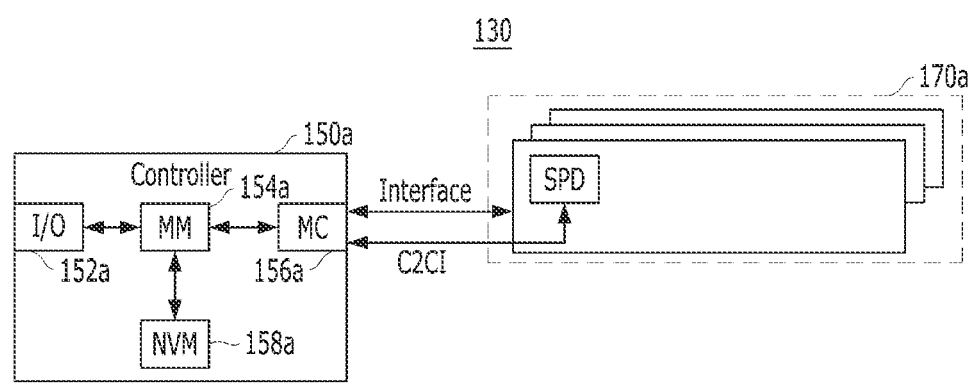
FIG. 12 illustrates a structure of a memory system in a data processing system in accordance with an embodiment.

FIG. 12 schematically illustrates another structure of the memory system 130 in the data processing system 100 in accordance with an embodiment.

FIG. 12 schematically illustrates only the first controller 150*a* in the memory system 130 and the first memory group 170*a* electrically coupled to the first controller 150*a*.

In an embodiment, the first controller 150*a* may further include a nonvolatile memory (NVM) device 158*a* electrically coupled to the memory manager (MM) 154*a*, in addition to the I/O interface 152*a*, the memory manager 154*a* and the memory controller (MC) 156*a*. In an embodiment, the nonvolatile memory device 158*a* may be included in the first controller 150*a*. Alternatively, the nonvolatile memory device 158*a* may be provided externally to the first controller 150*a* and electrically coupled to the first controller 150*a*.

In an embodiment, the nonvolatile memory device 158*a* may store the characteristic data which the memory manager 154*a* has acquired from the SPD components of the memory units of the first memory group 170*a*. The nonvolatile memory device 158*a* may store the operation mode setting data and the memory training result data of the memory units of the first memory group 170*a*. In an embodiment, the nonvolatile memory device 158*a* may store the characteristic data, the operation mode setting data and the memory training result data of the memory units of the first memory group 170*a* in association with one another.

The structures of the second and third controllers 150*b* and 150*c* may correspond to the structure of the first controller 150*a*. That is, each of the second and third controllers 150*b* and 150*c* may include a nonvolatile memory device for storing the characteristic data, the operation mode setting data and the memory training result data. Regardless of whether a nonvolatile memory device is included in each of the controllers or provided externally to the controller, it is to be understood that the nonvolatile memory devices are associated with the respective controllers. Thus, the following description is based on the supposition that a corresponding nonvolatile memory device is included in each of the one or more controllers.

In an embodiment, each of the one or more controllers may acquire characteristic data from the SPD components of the memory units electrically coupled thereto, when power is supplied to the memory system 130. Furthermore, each of the one or more controllers may compare the acquired characteristic data to the characteristic data, which is stored in the nonvolatile memory device 158*a* included therein to determine whether each of the memory units has ever been included in the memory system 130. Based on the determination result, each of the one or more controllers may use the operation mode setting data and the memory training result data which are stored in the internal nonvolatile memory device to quickly complete the operation mode setting and memory training between a memory unit and the controller electrically coupled to the memory unit.

Figure 13:
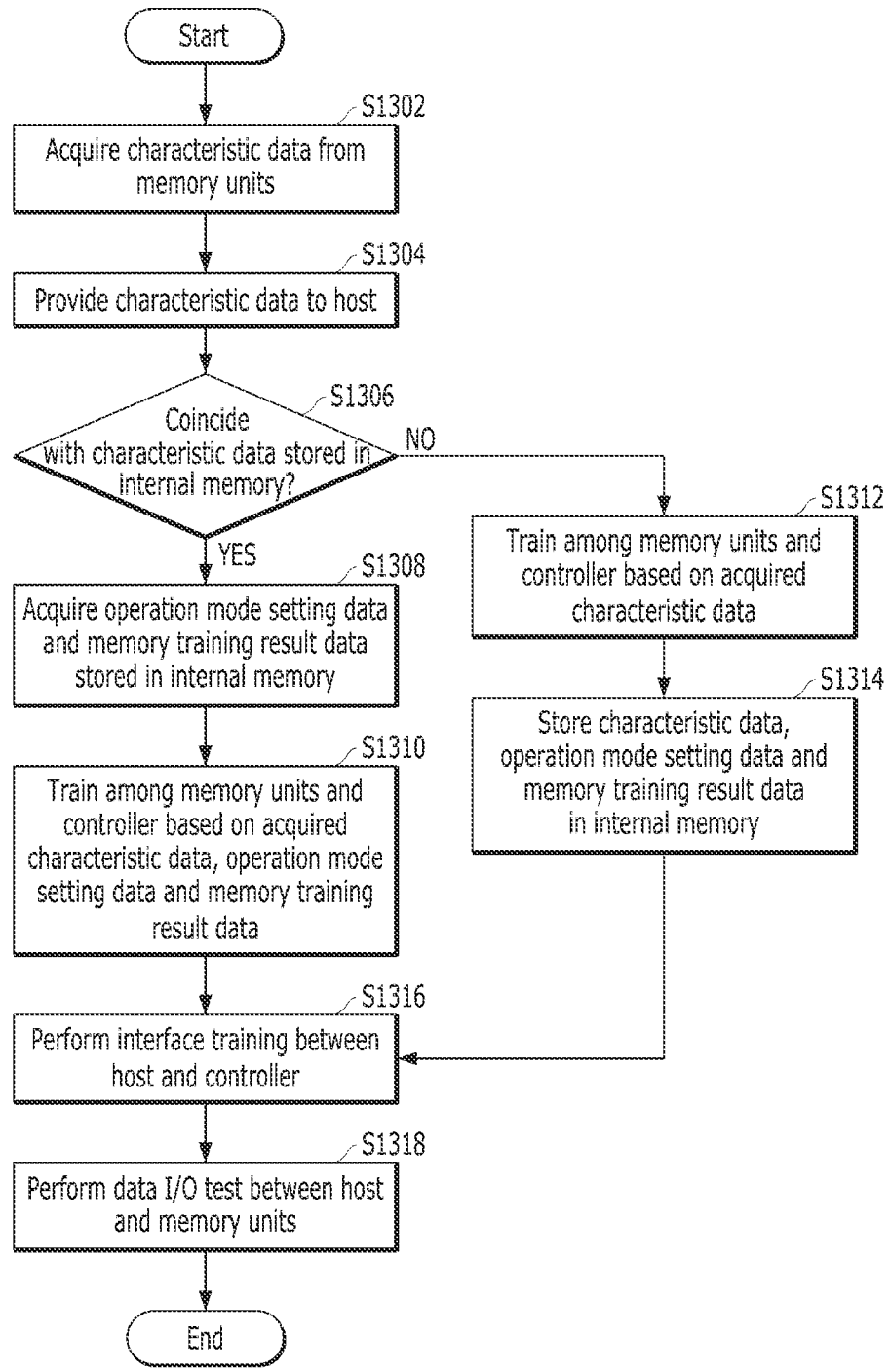
FIG. 13 is a flowchart illustrating an operation of a data processing system in accordance with an embodiment.

FIG. 13 is a flowchart illustrating an operation of the data processing system 100 in accordance with an embodiment.

Referring to FIG. 13, when power is supplied to the data processing system 100, the one or more controllers of the controller group 150 may sense the plurality of memory units in the memory pool 170 by acquiring characteristic data from the SPDs of the respective memory units, in step S1302.

In step S1304, the one or more controllers may provide the characteristic data to the host 110. In order to perform step S1304, the BIOS 112 may complete initial training of the I/O interface 114 in advance.

In step S1306, each of the one or more controllers may determine whether characteristic data stored in the internal nonvolatile memory device coincide with the characteristic data acquired from the SPD components.

The characteristic data of the respective memory units may coincide with the characteristic data stored in the nonvolatile memory device, or not coincide with the characteristic data stored in the nonvolatile memory device. A memory unit whose characteristic data coincides with the characteristic data stored in the nonvolatile memory device may be a memory unit which has ever been included in the memory system 130. A memory unit whose characteristic data does not coincide with the characteristic data stored in the nonvolatile memory device may be a new memory unit which has never been included in the memory system 130.

When it is determined that the memory unit whose characteristic data coincides with the characteristic data stored in the nonvolatile memory device ("YES" in step S1306), the one or more controllers may perform steps S1308 and S1310.

Specifically, the nonvolatile memory device may store operation mode setting data and memory training result data which are associated with the characteristic data of the corresponding memory unit, before power is supplied to the data processing system 100.

Therefore, in step S1308, each of the one or more controllers may acquire the operation mode setting data and the memory training result data of a memory unit from the internal nonvolatile memory device, among memory units electrically coupled to the one or more controllers. The memory unit may have the characteristic data which coincides with the characteristic data stored in the nonvolatile memory device.

In step S1310, the one or more controllers may use the operation mode setting data and the memory training result data, thereby reducing the time required for the operation mode setting and the memory training.

When it is determined that the memory unit whose characteristic data does not coincide with the characteristic data stored in the nonvolatile memory device ("NO" in step S1306), the one or more controllers may perform steps S1312 and S1314.

Specifically, the nonvolatile memory device may not store the characteristic data of the corresponding memory unit and the memory training result data of the corresponding memory unit.

Therefore, in step S1312, each of the one or more controllers may set the operation mode of the corresponding memory unit and perform memory training of the corresponding memory unit, among the memory units electrically coupled to the controller, based on the characteristic data. The characteristic data may be acquired from the SPD component of the memory unit whose characteristic data does not coincide with the characteristic data stored in the nonvolatile memory device.

In step S1314, each of the one or more controllers may store the set operation mode setting data and the memory training result data in the internal nonvolatile memory device.

In step S1316, the host 110 may perform fine training of the I/O interface 114, i.e., interface training.

In step S1318, the host 110 may provide read and write commands to the memory units in the memory pool 170, in order to perform a data I/O test.

When steps S1302 to S1318 are completed, the host 110 may allocate one or more memory units of the plurality of memory units based on the characteristic data received from the one or more controllers, and store data in the allocated one or more memory units.

In accordance with the present embodiment, the processing burden of the host 110 may be reduced during the booting operation of the data processing system 100. Furthermore, the one or more controllers may quickly perform the memory training of the memory units in the memory system 130 by storing the memory training result data of the memory units, thereby reducing the booting time of the data processing system 100.

Hereinafter, with reference to FIGS. 14 to 18, a data processing system capable of allocating memory devices to a current workload based on the average usage amount and write-to-read ratio of workloads having same type from the current workload and an operating method thereof will be described in more detail.

Figure 14:
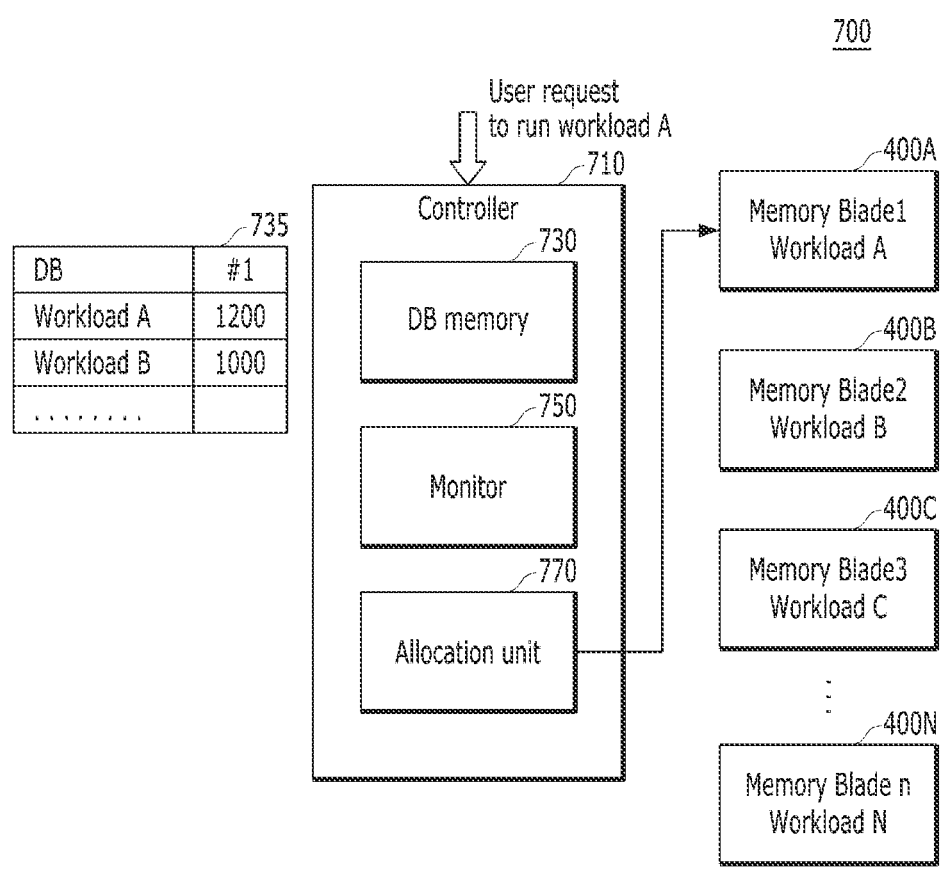
FIG. 14 is a block diagram illustrating a memory system 600 in accordance with an embodiment of the present invention.

FIG. 14 is a block diagram illustrating a memory system 700 in accordance with an embodiment of the disclosure.

Referring to FIG. 14, the memory system 700 may include a controller 710 and a plurality of memory blades 400. The controller 710 may include the computing blades 200 and the interconnecting blade 300 as shown in FIG. 3. The memory system 700 may be corresponding to the computing racks 20 as shown in FIG. 3. Accordingly, the controller 710 may communicate with each of the memory blades 400, and divide, allocate or designate one or more memory blades among the memory blades 400. In addition, the controller 710 may initialize one or more memory blades which are divided, allocated or designated, and may perform a read operation, a write (or program) operation and so on of data through the memory blades.

The controller 710 may further include a data base (DB) memory 730, a monitor 750 and an allocation unit 770.

The DB memory 730 may store a data base (DB) 735. The DB 735 may include information on workloads requested to be processed. Specifically, the DB 735 may include first information #1 which is an average operation memory usage amount used for processing the workloads. Although not illustrated, the DB 735 may include second information #2 which is a final operation memory usage amount used for processing the workloads, third information #3 which is the number of times to process the workloads, and fourth information #4 on a ratio of an operation for processing the workloads, i.e., a ratio of the write operation with respect to the read operation. The DB 735 may have fields of the first to fourth information #1 to #4 and be composed of the workloads as an entry. By way of example but not limitation, a value of the first information #1 of a workload A, that is, an average operation memory usage amount used for processing the workload A may be registered as "1200" in the DB 735 shown in FIG. 14. However, a workload that has not been processed in the memory system 700 may not be registered in the DB 735. Accordingly, such workload may be newly registered in the DB 735.

The monitor 750 may check whether a value of the first information #1 corresponding to a workload requested to be processed is stored in the DB memory 730. As described above, when the value of the first information #1 is not registered in the DB 735, the monitor 750 may register information on a corresponding workload in the DB 735. When the value of the first information #1 is registered in the DB 735, the value of the first information #1 may be a criterion of a memory allocation amount for processing the corresponding workload. In addition, the monitor 750 may update the DB 735 by checking the first to fourth information #1 to #4 after the processing of the workloads is completed. Particularly, the first information may be calculated using the second information #2 which is the final operation memory usage amount used for processing the workload and the third information #3 which is the number of times to process the workload. The monitor 750 may check the fourth information #4 to determine whether a corresponding workload is an operation optimized for the read operation or an operation optimized for the write operation. The fourth information #4 may be calculated according to a predetermined criterion. Specifically, the fourth information #4 may be a ratio of a write request with respect to a read request performed to process a target workload. More details will be described below with reference to FIG. 16.

The allocation unit 770 may allocate an operation memory usage amount to process the workloads based on the values of the first information #1 stored in the DB 735. When the target workload is not registered in the entry of the DB 735, the allocation unit 770 may allocate a predetermined memory usage amount. The allocation unit 770 may reflect a predetermined over-provision value in the values of the first information #1 to allocate the operation memory usage amount. By way of example but not limitation, when the value of the first information #1 of the workload A is "1200", the allocation unit 770 may not allocate the operation memory usage amount as "1200," but may allocate the operation memory usage amount as "1320" obtained by reflecting the over-provision value in the value of the first information #1, that is, by adding approximately 10% to the value of the first information #1. When additional allocation is requested due to a lack of an operation memory allocation amount, the allocation unit 770 may allocate an additionally predetermined operation memory usage amount dynamically.

To handle the workloads based on the value of the first information #1 stored in the DB 735, the allocation unit 770 may assign an operation memory usage amount to any one of a plurality of operation memories. For example, when the workloads are optimized for the read operation, the allocation unit 770 may allocate the operation memory usage amount to a specific operation memory optimized for the read operation. When the workloads are optimized for the write operation, the allocation unit 770 may allocate the operation memory usage amount to another operation memory optimized for the write operation.

The memory blades 400 may include the plurality of operation memories. The operation memories may be divided into a read-type operation memory optimized for the read operation, a write-type operation memory optimized for the write operation and a normal-type operation memory, depending on a predetermined criterion. By way of example but not limitation, the read-type operation memory may use a 3-clock (three clock cycles) when the read operation is performed, while using a 7-clock (seven clock cycles) when the write operation is performed. The write-type operation memory may use the 7-clock when the write operation is performed, while using the 3-clock when the read operation is performed. The normal-type operation memory may use a 5-clock (five clock cycles) respectively when the read operation and the write operation are performed. This is merely an example, and the disclosure is not limited thereto. A clock to be used may be set reflecting speed and characteristics of a memory or selecting any one of existing options.

Figure 15:
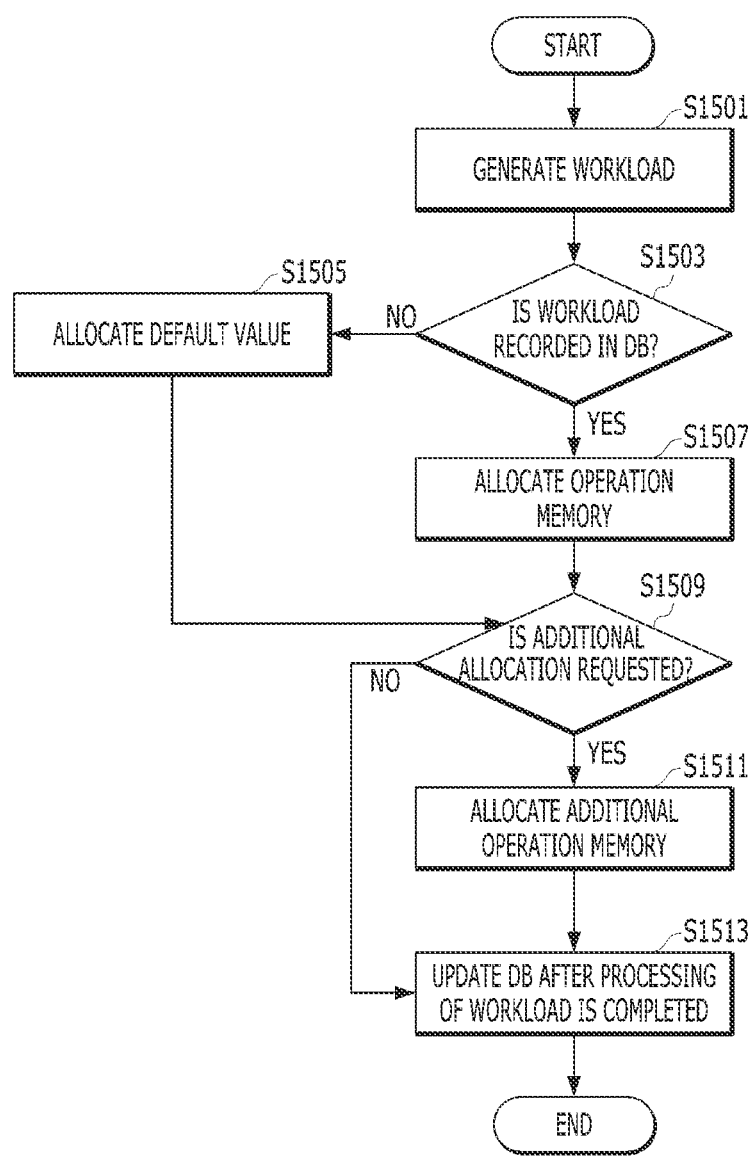
FIG. 15 is a flowchart illustrating an operation of the memory system 600 in accordance with an embodiment of the present invention.

FIG. 15 is a flowchart illustrating an operation of the memory system 700 in accordance with an embodiment of the disclosure.

In step S1501, a request for processing a workload may be generated from an external device.

In step S1503, the monitor 750 may check whether a requested workload is registered in the DB 735 by checking the DB 735 stored in the DB memory 730. Specifically, the monitor 750 may check whether a target workload is registered in an entry of the DB 735.

When the target workload is not registered in the entry (that is, "NO" in step S1503), the allocation unit 770 may allocate the predetermined operation memory usage amount to process the target workload in step S1505. A subsequent step S1509 may be carried out.

When the target workload is registered in the entry (that is, "YES" in step S1503), the allocation unit 770 may allocate the operation memory usage amount based on the values of the first information #1 registered in the DB 735 in step S1507. Although not illustrated, the allocation unit 770 may allocate the operation memory usage amount by reflecting the predetermined over-provision value.

In step S1509, the allocation unit 770 may receive a request for allocating an additional operation memory due to a lack of the operation memory allocation amount.

When additional allocation is requested (that is, "YES" in step S1509), the allocation unit 770 may allocate the additional operation memory usage amount with a predetermined value in step S1511.

When additional allocation is not requested (that is, "NO" in step S1509), the allocation unit 770 may carry out a subsequent step S1513.

In step S1513, the monitor 750 may update the first to fourth information #1 to #4 stored in the DB 735 after the processing of the workload is completed. When a request for processing the same workload is subsequently generated, an operation memory usage amount may be appropriately allocated based on the updated DB 735 as described above, and the additional operation memory allocation may be reduced so that performance of the memory system 700 may be enhanced.

Figure 16:
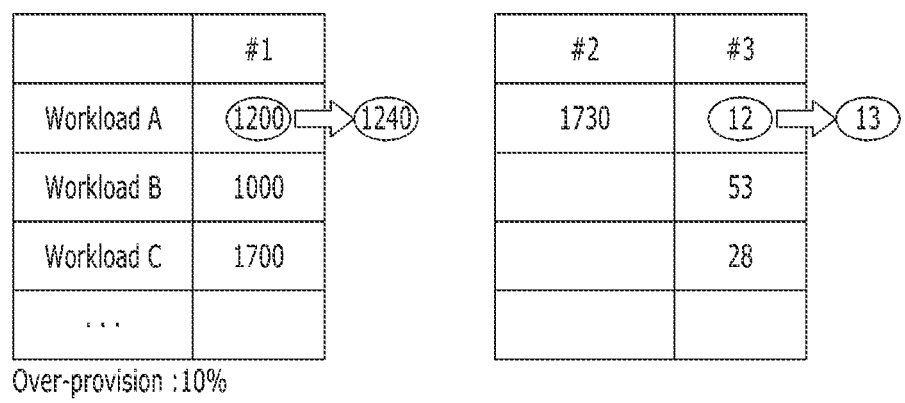
FIG. 16 is a diagram illustrating the values registered in the DB 635 in accordance with an embodiment of the present invention.

FIG. 16 is a diagram illustrating the values registered in the DB 735 in accordance with an embodiment of the disclosure.

As described above, the DB 735 may have fields of the first to fourth information #1 to #4 which are composed of the workloads as entries. Only the workloads that have been processed may be registered in the DB 735.

The first information #1 may represent an average operation memory usage amount used for processing a corresponding workload. By way of example but not limitation, an average operation memory usage amount used for processing the workload A may be registered as "1200." As described above, the allocation unit 770 may initially allocate an operation memory corresponding to the registered amount "1200" to process the workload A. When the over-provision is approximately 10%, the allocation unit 370 may allocate an operation memory usage amount corresponding to the amount "1320" obtained by adding approximately 10% of "1200" to the operation memory usage amount "1200."

The second information #2 may represent a final operation memory usage amount used for processing the workload A. Considering that a value of the second information #2 is "1730," it is likely that additional operation memory allocation is required due to a lack of an operation memory amount corresponding to "1320" which is initially allocated.

The third information #3 may represent the number of times to process the workload A up to the present. Considering that a value of the third information #3 is "12", the controller 710 may complete processing the workload A 12 times. When the processing of the workload A is further completed, the value of the third information #3 may be updated to "13".

After the processing of the target workload is completed, the monitor 750 may update the first information #1, that is, the average operation memory usage amount used for processing the workload A. The average operation memory usage amount may be obtained by dividing the sum of an initial operation memory allocation amount to a final operation memory usage amount by the number of processing times.

By way of example but not limitation, after the processing of the workload A is completed, the monitor 750 may update the value of the second information #2 and the value of the third information #3. The monitor 750 may calculate the average operation memory allocation amount as "1240"= ([(12*1200)+1730]/13).

In short, the value of the first information #1 may be updated based on the above calculation.

Figure 17:
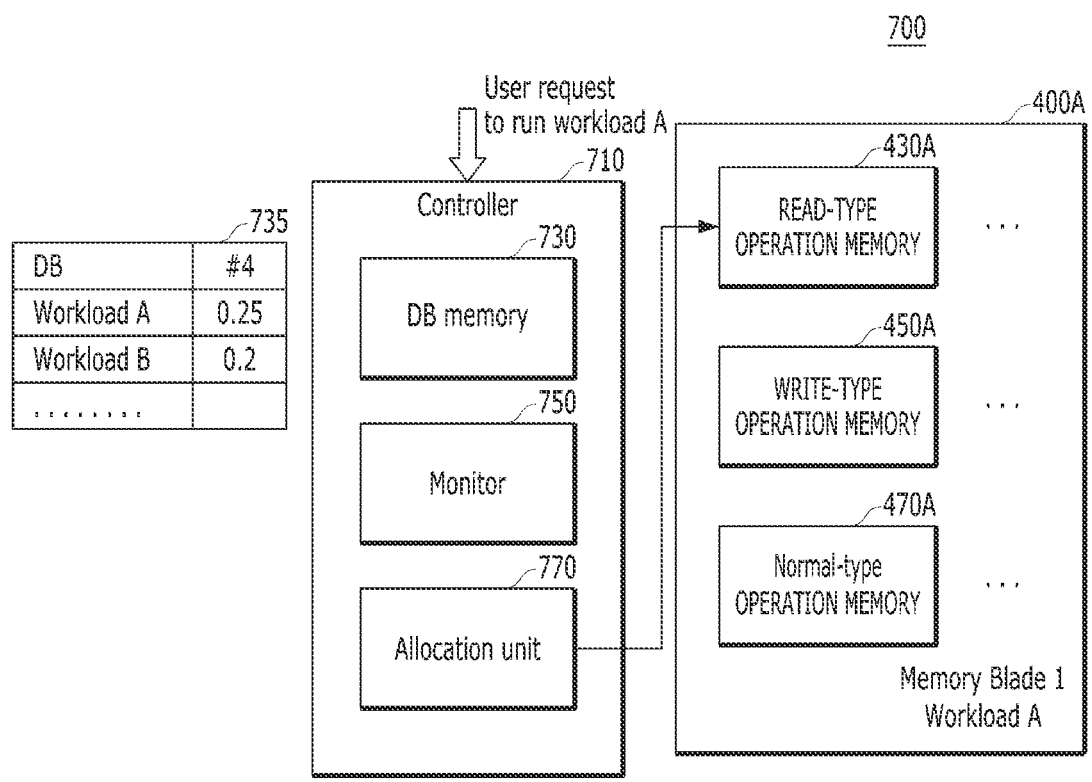
FIG. 17 is a block diagram illustrating an operation of the memory system in accordance with an embodiment of the present invention.

FIG. 17 is a block diagram illustrating an operation of the memory system 700 in accordance with an embodiment of the disclosure. Specifically, FIG. 17 shows a system capable of identifying characteristics of a target workload requested to be processed to allocate an optimized operation memory for processing the target workload.

The monitor 750 may check whether a workload requested to be processed is stored in the entry of the DB 735. As described above, when the target workload is not registered in the entry of the DB 735, the monitor 750 may register information on the workload in the DB 735. When the target workload is registered in the entry of the DB 735, a value of the first information #1 may be a criterion of a memory usage amount for processing the workload. As described above, the monitor 750 may update the first to fourth information #1 to #4 after the processing of the target workload is completed. The fourth information #4 may represent a ratio of a write request with respect to a read request for processing the target workload.

The allocation unit 770 may allocate a workload to an operation memory capable of efficiently processing the workload based on a value of the fourth information #4 stored in the DB 735. The allocation unit 770 may determine which operation the target workload is optimized for, based on the fourth information #4 according to the predetermined criterion. By way of example but not limitation, when the number of read requests to process the target workload is approximately 20% greater than the number of write requests, it may be efficient from a system point of view that the target workload is allocated to a read-type operation memory optimized for the read operation. By way of example but not limitation, when the ratio of the read operation performed to process the workload A to the ratio of the write operation, is higher than a predetermined threshold value, the allocation unit 770 may allocate the workload A to the read-type operation memory optimized for performing the read operation.

Each of the memory blades 400A to 400N may have a plurality of operation memories. By way of example but not limitation, a first memory blade 400A for processing the workload A may be split into a read-type operation memory 430A optimized for the read operation, a write-type operation memory 450A optimized for the write operation, and a normal-type operation memory 470A. A user may determine, establish, or set the types of the operation memories. By way of example but not limitation, the read-type operation memory 430A for the read operation may be allocated to "3" for a clock required for the read operation and "7" for a clock required for the write operation. The write-type operation memory 450A for the write operation may be allocated to "3" for a clock required for the write operation and "7" for a clock required for the read operation. Further, the normal-type operation memory 470A may be allocated equally for clocks required for the read operation and the write operation. Therefore, when the ratio of the read operation is higher than the ratio of the write operation among the operations requested to process the workload A, the allocation unit 770 may allocate the workload A to the read-type operation memory 430A among the plurality of operation memories of the first memory blade 400A.

Figure 18:
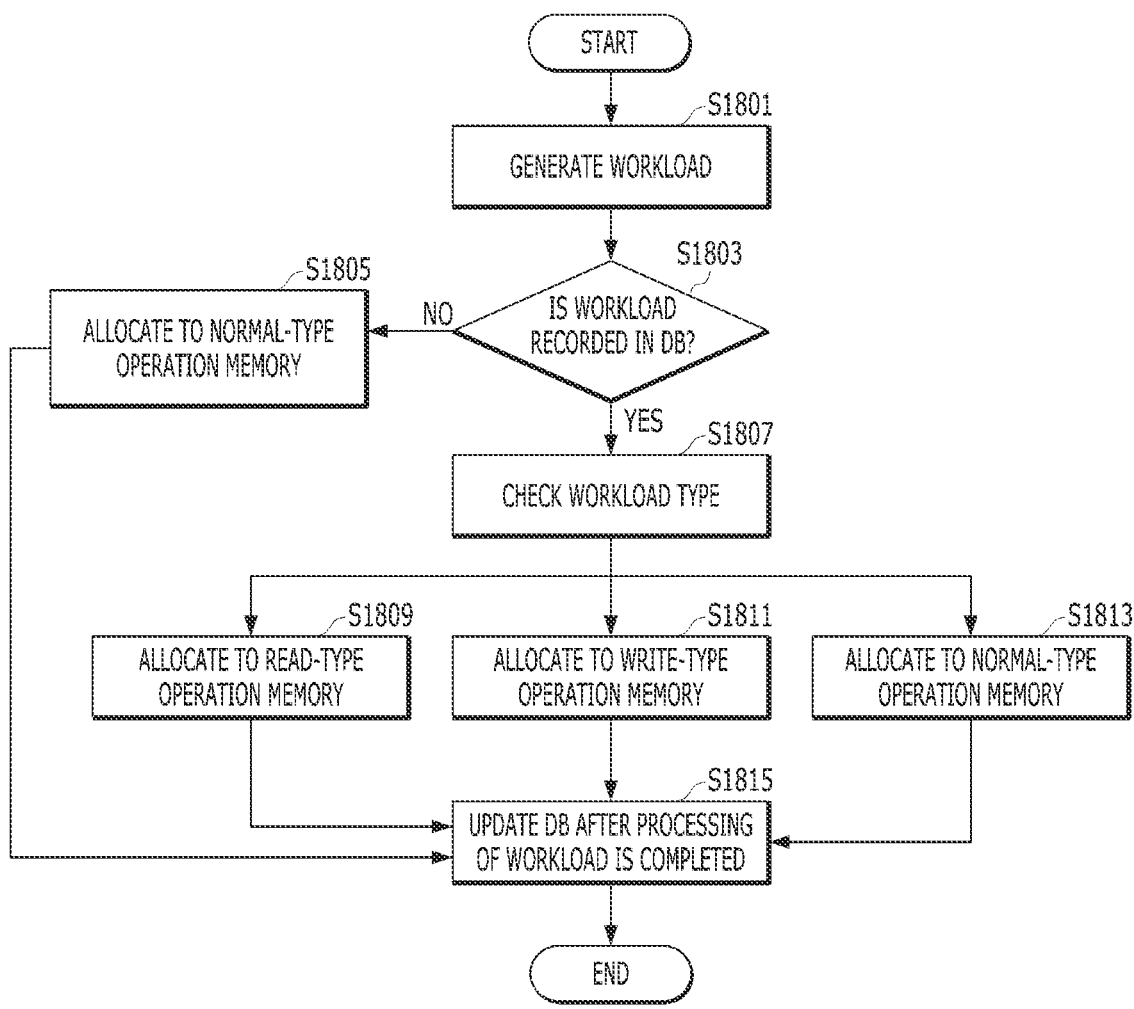
FIG. 18 is a flowchart illustrating an operation of the memory system in accordance with an embodiment of the present invention.

FIG. 18 is a flowchart illustrating an operation of the memory system 700 in accordance with an embodiment of the present invention.

In step S1801, a request for processing a workload may be generated from an external device.

In step S1803, the monitor 750 may check whether a requested workload is registered in the DB 735 by checking the entry of the DB 735 stored in the DB memory 730.

When the target workload is not registered in the entry (that is, "NO" in step S1803), the allocation unit 770 may allocate the target workload to the normal-type operation memory to process the target workload in step S1805.

When the target workload is registered in the entry (that is, "YES" in step S1803), the allocation unit 770 may check the ratio of the write request with respect to the read request for processing the workload based on the value of the fourth information #4 registered in the DB 735 in step S1807.

When the ratio of the read request for processing the workload is higher than the ratio of the write request ("read-type" in step S1807), the allocation unit 770 may allocate the workload to the read-type operation memory optimized for the read operation in step S1809.

When the ratio of the write request for processing the workload is higher than the ratio of the read request ("write-type" in step S1807), the allocation unit 770 may allocate the workload to the write-type operation memory optimized for the write operation in step S1811.

When the ratio of the read request is the same as the ratio of the write request ("normal-type" in step S1807), the allocation unit 770 may allocate the workload to the normal-type operation memory to process the workload in step S1813.

In step S1815, the monitor 750 may update the fourth information #4 stored in the DB 735 after the processing of the workload is completed. When a request for processing the same workload is subsequently generated, the target workload may be allocated to the optimal operation memory based on the updated DB 735 as described above so that performance of the memory system 700 may be maximized.

In embodiments of the disclosure, in order to efficiently process a workload generated from an external device, the controller 710 may create the DB 735 for the processing of the workload, and allocate an optimal operation memory usage amount based on the DB 735 for a workload that has been processed. As a result, the additional operation memory allocation may be reduced so that the entire system may shorten the waiting time required for allocating the operation memory. In addition, the controller 710 may divide a plurality of memories into memories optimized for a plurality of operations so as to efficiently process the workload. Consequently, the entire system may efficiently process the workload generated from the external device in a short time.

Hereinafter, with reference to FIGS. 19 to 26, a data processing system capable of detecting a defective memory device among the memory devices and efficiently recovering the defective memory device and an operating method thereof will be described in more detail.

Figure 19:
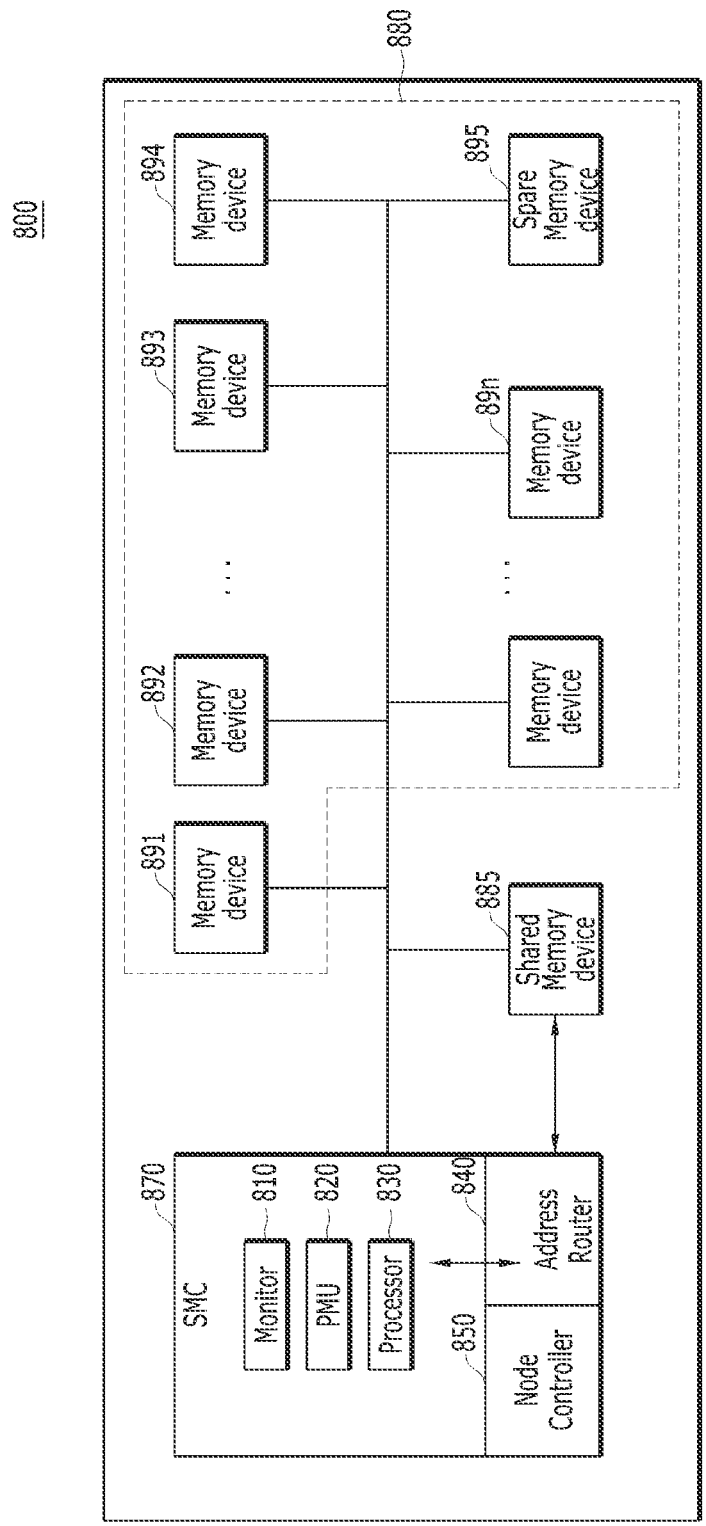
FIG. 19 is a diagram schematically illustrating a memory blade in accordance with an embodiment of the present disclosure.

FIG. 19 is a diagram schematically illustrating a memory blade 800 in accordance with an embodiment of the present disclosure.

Referring to FIGS. 5 and 19, the memory blade 800 may correspond to the memory blade 400 described with reference to FIG. 5. The memory blade 800 may include a controller 870 and a local memory device unit 880. The local memory device unit 880 may include a plurality of memory devices 891 to 89N mounted on a plurality of dual in-line memory module (DIMM) slots. The controller 870 may correspond to the controller 410 described with reference to FIG. 5. Each of the plurality of memory devices 891 to 89N may correspond to the memory 420 described with reference to FIG. 5.

The memory blade 800 may further include one or more shared memory devices 885. Life cycles of the plurality of memory devices 891 to 89N may be different from one another. An error may independently occur in an individual one among the plurality of memory devices 891 to 89N. Therefore, each of the plurality of memory devices 891 to 89N may be required to independently correct an error occurring therein. For example, an individual memory device where an error occurs, among the plurality of memory devices 891 to 89N, may be replaced with a new memory device. Further, in accordance with an embodiment of the present disclosure, the memory blade 800 may further include spare memory devices 895 at one or more DIMM slots. Although not illustrated, the spare memory devices 895 may include one or more memory devices.

The shared memory devices 885 of the memory blade 800 may store data, which another memory blade read-requests or write-requests. For example, when a first memory blade sends a read request to a second memory blade, e.g., the memory blade 800, if the second memory blade 800 stores location information of data corresponding to the read request in the plurality of memory devices 891 to 89N, the controller 870 of the second memory blade 800 may control the plurality of memory devices 891 to 89N to store the data corresponding to the read request in the shared memory devices 885 of the second memory blade 800. Further, the shared memory devices 885 may manage data stored therein through queues. When a number of queues becomes greater than a threshold value, data stored in the shared memory devices 885 may be moved into the local memory device unit 880 including the plurality of memory devices 891 to 89N. The shared memory devices 885 may include a plurality of input/output channels. Therefore, the shared memory devices 885 may communicate with the controller 870 and an address router 840, respectively. The shared memory devices 885 will be described in detail with reference to FIG. 25.

The controller 870 may include a monitor 810, a power management unit (PMU) 820, a processor 830, the address router 840, and a node controller 850.

The monitor 810 may periodically determine whether defects occur in the plurality of memory devices 891 to 89N. In an embodiment, the monitor 810 may check an error occurrence frequency of each of the plurality of memory devices 891 to 89N, and may determine a memory device having the error occurrence frequency that is greater than a first threshold value, as a defective memory device, among the plurality of memory devices 891 to 89N. In another embodiment, the monitor 810 may detect a temperature of each of the plurality of memory devices 891 to 89N, and may determine a memory device having a temperature that is greater than a second threshold value, as a defective memory device, among the plurality of memory devices 891 to 89N.

When a memory device is determined as a defective memory device among the plurality of memory devices 891 to 89N, the monitor 810 may store location information of the defective memory device. Also, the monitor 810 may periodically set flags indicating availabilities of the plurality of memory devices 891 to 89N, and store the set flags in a flag table. The monitor 810 may periodically update the flag table. For example, the flag table may have information indicating availabilities of the spare memory devices 895. In detail, the monitor 810 may identify the availabilities of the spare memory devices 895 by referring to the flag table, and may periodically update the flag table by communicating with the spare memory devices 895. Also, when a plurality of memory devices are determined as defective memory devices, the monitor 810 may set a processing order of backup operations to be performed on the plurality of defective memory devices. The backup operation will be described in detail later.

For example, the monitor 810 may assign the highest priority to a backup operation for a first defective memory device, which has an error occurrence frequency that is greater than the first threshold value, among a plurality of defective memory devices. Also, the monitor 810 may assign a lower priority to a backup operation for a second defective memory device, which has a current that is greater than a third threshold value or has a temperature that is greater than the second threshold value, compared to the first defective memory device, among the plurality of defective memory devices. The plurality of defective memory devices may be queued according to the priorities of the backup operations in order. The monitor 810 may store the priority order of the plurality of defective memory devices for performing the backup operations. The backup operations for the defective memory devices having lower priorities may not be performed until the backup operations for the defective memory devices having higher priorities are complete.

The power management unit 820 may manage power supply to components included in the controller 870. The power management unit 820 may also manage power supply to the plurality of memory devices 891 to 89N. For example, the power management unit 820 may cut off power supply to a DIMM slot of a defective memory device and may allow power supply to DIMM slots of the spare memory devices 895. The power management unit 820 may separately manage power supply to the shared memory devices 885 from power supply to the local memory device unit 880. The power management unit 820 may individually manage power supply to each of the components included in the controller 870. For example, the power management unit 820 may allow power supply to only the address router 840, the node controller 850, and the shared memory devices 885. The independency of the address router 840, the node controller 850, and the shared memory devices 885 may be enhanced because of the independent power supply management by the power management unit 820.

The processor 830 may control the overall operation of the memory blade 800. The processor 830 may control the shared memory devices 885, the local memory device unit 880, and the spare memory devices 895 to perform a backup operation of copying data from a defective memory device into the spare memory devices 895.

The address router 840 and the node controller 850 may be included in the controller 870 as illustrated in FIG. 19. However, in another embodiment, the address router 840 and the node controller 850 may be arranged outside the controller 870 as separate components in the memory blade 800.

The node controller 850 may receive a request provided from another memory blade. In detail, a request provided from another memory blade may be transferred to the node controller 850 through a memory blade management unit, which will be described with reference to FIG. 20.

The address router 840 may determine a location of a memory device based on meta information of data corresponding to the request received by the node controller 850. The address router 840 may change a logical address into a physical address. The meta information may be used to change the logical address into the physical address, and may be stored in the address router 840 or the shared memory devices 885. The meta information will be described later with reference to FIG. 26.

Although not illustrated in FIG. 19, each of the plurality of DIMM slots may have an LED indicator. An LED indicator may indicate a current status of a memory device that is inserted into a corresponding DIMM slot. For example, when an operation of the corresponding memory device is in a normal state, the LED indicator may turn on green light. On the other hand, when the corresponding memory device is in a bad state, for example, when an error occurrence frequency of the corresponding memory device becomes close to the first threshold value, the LED indicator may turn on yellow light. When the corresponding memory device is determined as a defective memory device and thus waiting for a backup operation, the LED indicator may turn on red light.

During a backup operation of copying data from a defective memory device into the spare memory devices 895, an LED indicator of a DIMM slot on which the defective memory device is mounted may flash red light. On the other hand, during the backup operation of copying the data from the defective memory device into the spare memory device 895, an LED indicator of a DIMM slot on which the spare memory device 895 is mounted may flash blue light. When the spare memory device 895 operates instead of the defective memory device, the LED indicator of the DIMM slot on which the spare memory device 895 is mounted may turn on blue light.

Figure 20:
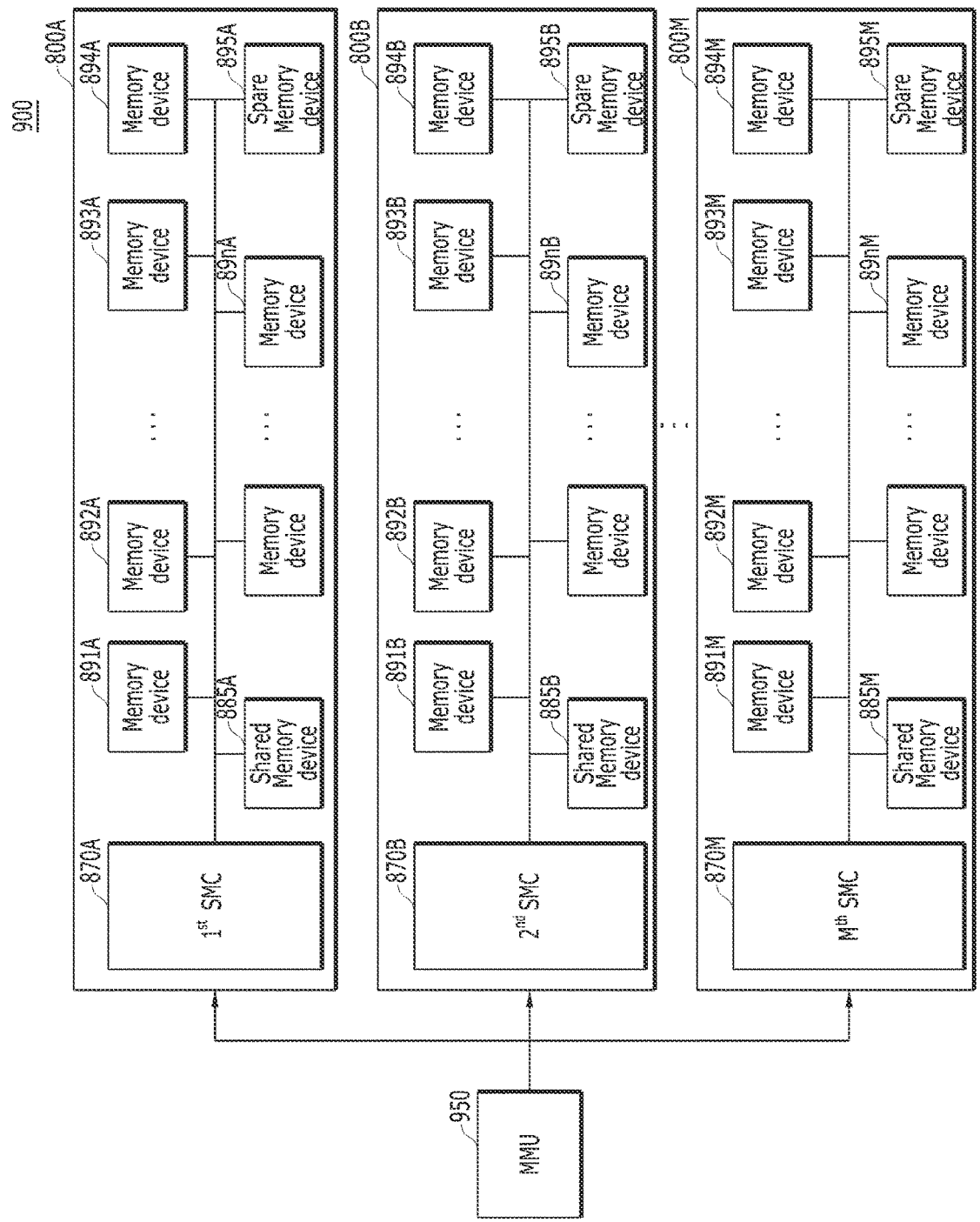
FIG. 20 is a diagram schematically illustrating a computing device in accordance with an embodiment of the present disclosure.

FIG. 20 is a diagram schematically illustrating a computing device 900 in accordance with an embodiment of the present disclosure.

The computing device 900 may include a memory blade management unit (MMU) 950 and a plurality of memory blades 800A to 800M, M being a positive integer. The memory blade management unit 950 may be included in the compute blade 200 described above with reference to FIGS. 3 and 4.

The memory blade management unit 950 may communicate with each of the plurality of memory blades 800A to 800M through the interconnect blade 300 described above with reference to FIG. 3. The memory blade management unit 950 may control each of the plurality of memory blades 800A to 800M. Each of the plurality of memory blades 800A to 800M may correspond to the memory blade 800 shown in FIG. 19. In particular, the memory blade management unit 950 may control each of a plurality of controllers 870A to 870M respectively included in the plurality of memory blades 800A to 800M. Each of the plurality of controllers 870A to 870M may correspond to the controller 870 shown in FIG. 19. Further, the memory blade management unit 950 may store therein a global map storing a flag table of each of the plurality of memory blades 800A to 800M and location information of a plurality of memory devices 891*x* to 89N*x* included in each of the plurality of memory blades 800A to 800M, x being any of A to M. The memory blade management unit 950 may update the global map by periodically communicating with each of the plurality of memory blades 800A to 800M since the plurality of memory blades 800A to 800M may communicate with one another through the memory blade management unit 950.

Referring back to FIG. 19, the node controller 850 of the memory blade 800 may receive a read request or a write request provided from another memory blade. The memory blade management unit 950 shown in FIG. 20 may transfer data corresponding to the read request or the write request. For example, referring to FIGS. 19 and 20, a first node controller included in the first memory blade 800A may perform a data communication with a second node controller included in the second memory blade 800B through the memory blade management unit 950.

When the second memory blade 800B tries to access a target memory device included in the first memory blade 800A, the second memory blade 800B may provide the memory blade management unit 950 with an access request for accessing the first memory blade 800A through the second node controller of the second memory blade 800B. Then, the memory blade management unit 950 may forward the access request to the first node controller of the first memory blade 800A based on the global map. Address information of data corresponding the access request may be forwarded to a first address router included in the first memory blade 800A. The first address router of the first memory blade 800A may locate the target memory device in the first memory blade 800A for the data corresponding to the access request based on meta information of the data corresponding to the access request. An operation of the first memory blade 800A in response to the access request from the second memory blade 800B will be described later with reference to FIG. 25.

Figure 21:
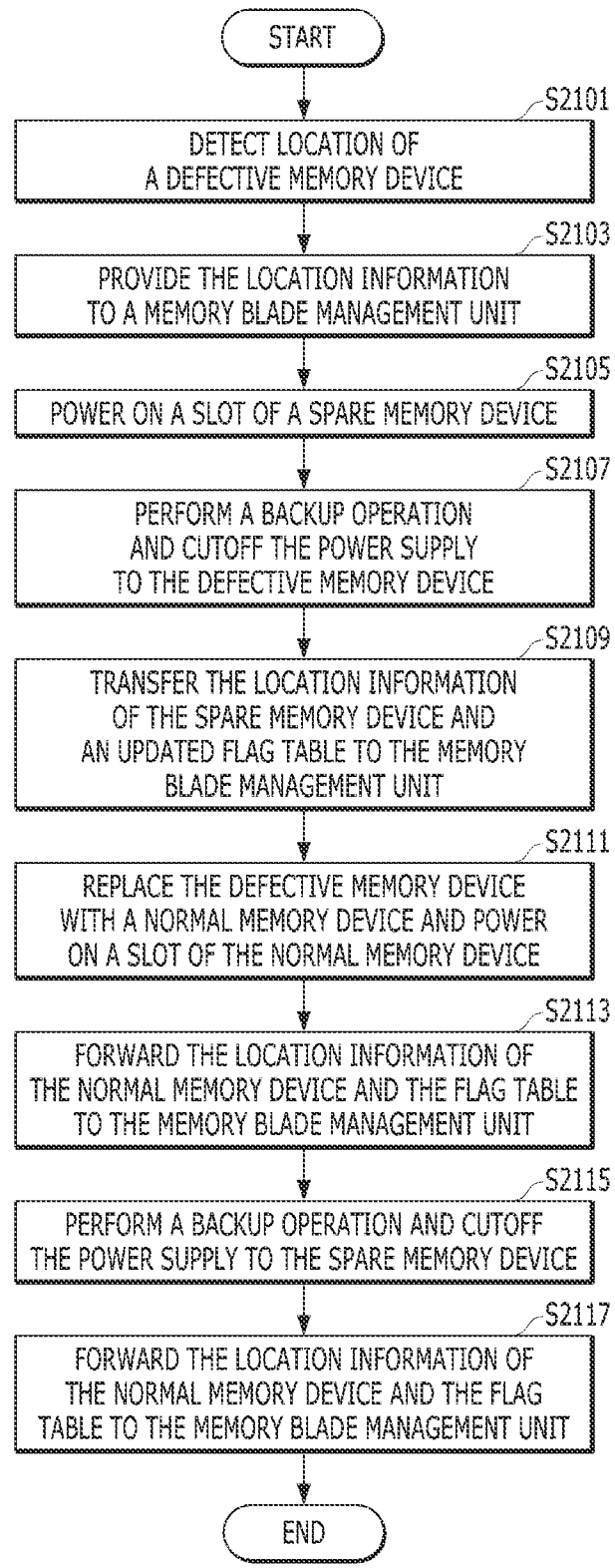
FIG. 21 is a flowchart schematically illustrating an operation of a computing device in accordance with an embodiment of the present disclosure.

FIG. 21 is a flowchart schematically illustrating an operation of a computing device. Hereinafter, it is assumed that a flag has a value of one (1) when a corresponding memory device is available and the flag has a value of zero (0) when the corresponding memory device is not available. The operation of the computing device shown in FIG. 21 will be described with reference to FIGS. 19 and 20.

At step S2101, the monitor 810 may detect a location of a first DIMM slot on which a defective memory device is mounted, and may store therein location information of the defective memory device. Although not illustrated, the monitor 810 may detect availabilities of the spare memory devices 895 by referring to a flag table. Further, an LED indicator provided at the first DIMM slot on which the defective memory device is mounted may turn on red light.

At step S2103, the monitor 810 of the controller 870 may provide the location information indicating the location of the first DIMM slot to the memory blade management unit 950. Also, the controller 870 may provide the flag table to the memory blade management unit 950. The memory blade management unit 950 may update a global map based on the provided flag table. When a flag corresponding to a first spare memory device 895 has a value of one (1), the memory blade management unit 950 may control the memory blade 800 such that a request to be provided to the defective memory device is transferred to the first spare memory device 895.

At step S2105, the power management unit 820 may power on a second DIMM slot on which the first spare memory device 895 is mounted under the control of the memory blade management unit 950.

At step S2107, when the second DIMM slot of the first spare memory devices 895 is powered on, the processor 830 may control the defective memory device and the first spare memory device 895 to perform a backup operation to copy data from the defective memory device into the first spare memory device 895. During the backup operation, the LED indicator provided at the first DIMM slot may flash red light while an LED indicator provided at the second DIMM slot may flash blue light. After completion of the backup operation, the power management unit 820 may cut off the power supply to the defective memory device. Further, the monitor 810 may update the flag table such that the flag corresponding to the first spare memory device 895 has a value of zero (0). Also, the LED indicator provided at the second DIMM slot may turn on blue light.

At step S2109, the controller 870 may transfer location information of the first spare memory device 895 and the updated flag table to the memory blade management unit 950. The memory blade management unit 950 may update the global map based on the location information of the first spare memory device 895 and the updated flag table. Therefore, the memory blade management unit 950 may forward a read request or write request generated by an external device (e.g., a host) to the first spare memory device 895. In detail, the processor 830 may control the first spare memory device 895 to perform an operation in respond to the read request or write request instead of the defective memory device. Also, the memory blade management unit 950 may identify that the first spare memory devices 895 in a corresponding memory blade is not available based on the global map.

At step S2111, the defective memory device may be repaired. For example, the defective memory device may be replaced with a normal memory device in the same memory blade. When the defective memory device is replaced with the normal memory device, the power management unit 820 may automatically power on a DIMM slot on which the normal memory device is mounted. Although not illustrated, the monitor 810 may update the flag table for a flag corresponding to the normal memory device to have a value of one (1).

At step S2113, the controller 870 may forward location information of the normal memory device and the flag table to the memory blade management unit 950. The memory blade management unit 950 may update the global map based on the location information of the normal memory device and the flag table. Then, the memory blade management unit 950 may control the normal memory device and the first spare memory device 895 such that the read request and write request generated by the external device is provided to the normal memory device instead of the first spare memory device 895.

In another embodiment, although not illustrated, the memory blade management unit 950 may designate the normal memory device as a new spare memory device. Therefore, the first spare memory device 895, rather than the normal memory device, may operate instead of the defective memory device since the normal memory device is used as a spare memory device.

At step S2115, under the control of the memory blade management unit 950, the processor 830 may control the first spare memory device 895 and the normal memory device to move data from the first spare memory device 895 to the normal memory device. That is, the processor 830 may control the first spare memory devices 895 and the normal memory device to perform a backup operation of copying data of the first spare memory device 895 into the new memory device. During the backup operation, the LED indicator of the second DIMM slot, on which the first spare memory devices 895 is mounted, may flash red light, and an LED indicator of a third DIMM slot, on which the normal memory device is mounted, may flash blue light. Upon completion of the backup operation, the power management unit 820 may cut off the power supply to the first spare memory device 895. The LED indicator of the third DIMM slot may turn on green light. The monitor 810 may update the flag table such that the flag corresponding to the first spare memory device 895 has a value of one (1) and the flag corresponding to the normal memory device has a value of zero (0).

At step S2117, the controller 870 may forward the location information of the normal memory device and the flag table to the memory blade management unit 950. The memory blade management unit 950 may update the global map based on the location information of the normal memory device and the flag table. Therefore, the memory blade management unit 950 may forward the read request or write request generated by the external device (e.g., the host) to the normal memory device.

Through steps S2101 to S2117, the computing device 900 may secure data stored in the defective memory device and may keep data normal in a system. Further, even when a defective memory device occurs, the defective memory device may be replaced with a normal memory device without giving a burden to the system.

Figure 22:
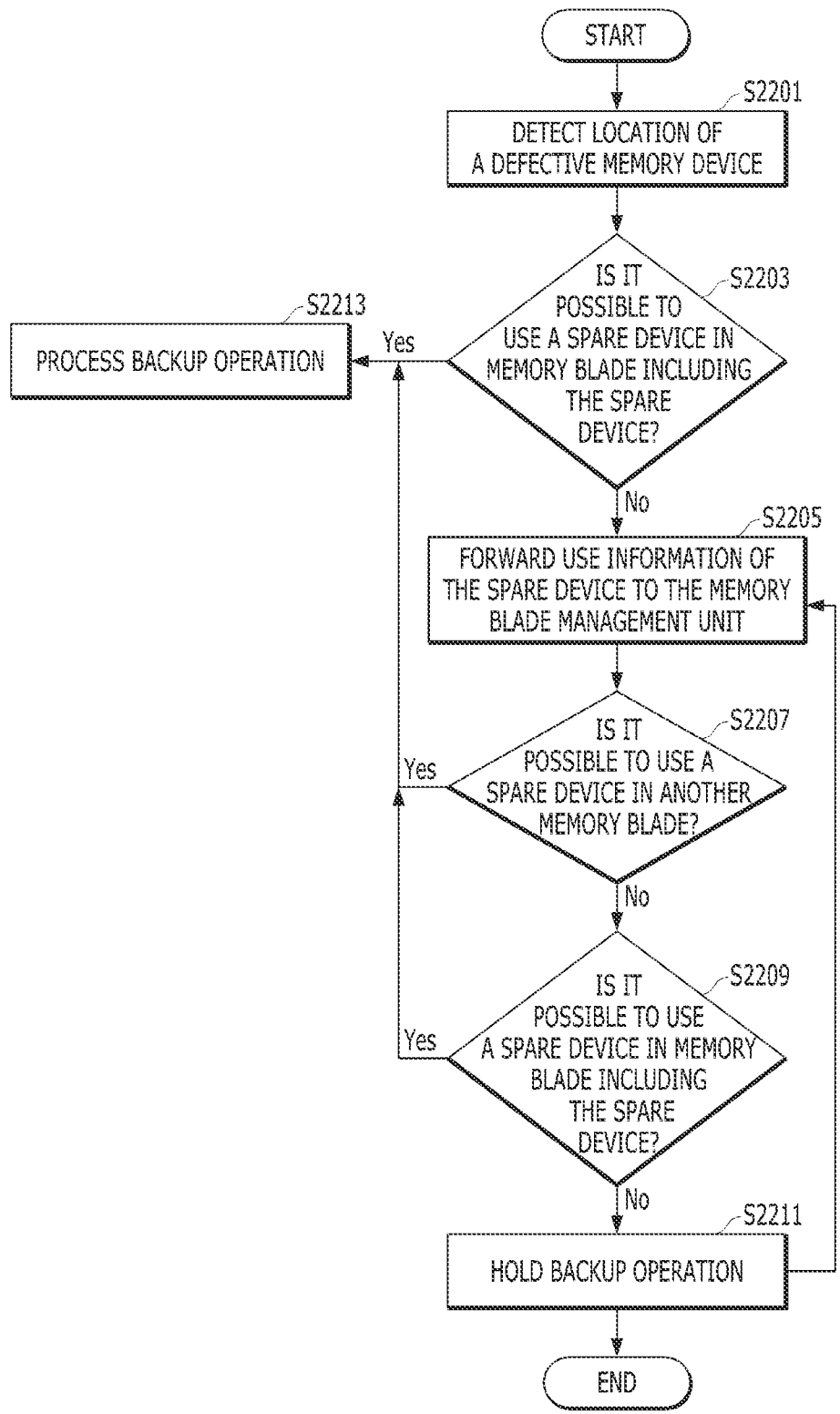
FIG. 22 is a flowchart schematically illustrating an operation of a computing device in accordance with an embodiment of the present disclosure.

FIG. 22 is a flowchart schematically illustrating an operation of a computing device according to an embodiment of the present disclosure. FIG. 22 shows an operation of the computing device 900 shown in FIG. 20. The computing device 900 uses a second spare memory device of the second memory blade 800B when spare memory devices of the first memory blade 800A are already taken for use or are not available. Each of the first and second memory blades 800A and 800B has the same structure as the memory blade 800 shown in FIG. 19.

At step S2201, a monitor in the first controller 870A of the first memory blade 800A may detect a location of a DIMM slot on which a defective memory device is mounted, and may store therein location information of the defective memory device.

At step S2203, the monitor may identify the availability of a first spare memory device 895A of the first memory blade 800A by referring to a flag table.

When the first spare memory device 895A is available ('YES' at step S2203), that is, when a flag corresponding to the first spare memory device 895A has a value of one (1), a processor in the first controller 870A of the first memory blade 800A may control the first spare memory device 895A to perform a backup operation for the defective memory device at step S2213.

When the first spare memory device 895A is not available ('NO' at step S2203), that is, when the flag corresponding to the first spare memory device 895A has a value of zero (0), the first controller 870A may forward use information of the first spare memory device 895A, that is, the flag table including the flag to the memory blade management unit 950 at step S2205. The memory blade management unit 950 may update the global map according to the flag table.

At step S2207, the memory blade management unit 950 may search for a spare memory device for backing up data of the defective memory device included in the first memory blade 800A instead of the first spare memory device 895A based on the global map.

When a second spare memory device 895B of the second memory blade 800B is available ('YES' at step S2207), that is, when a flag corresponding to the second spare memory device 895B has a value of one (1), the memory blade management unit 950 may control the second spare memory device 895B to perform a backup operation for data stored in the defective memory device of the first memory blade 800A instead of the first spare memory device 895A at step S2213. In detail, the first processor in the first controller 870A of the first memory blade 800A may control the defective memory device to copy the data stored in the defective memory device of the first memory blade 800A, and a first node controller in the first controller 870A of the first memory blade 800A may forward the copied data to the memory blade management unit 950. Further, a second node controller in the second controller 870B of the second memory blade 800B may receive the copied data from the memory blade management unit 950, and a second processor in the second controller 870B of the second memory blade 800B may control the second spare memory device 895B to store the copied data in the second spare memory device 895B.

When the second spare memory device 895B is not available ('NO' at step S2207), that is, when the flag corresponding to the second spare memory device 895B has a value of zero (0), the memory blade management unit 950 may identify again the availability of the first spare memory device 895A from the global map at step S2209. That is, the memory blade management unit 950 may scan again the flag corresponding to the first spare memory device 895A of the first memory blade 800A.

When the first spare memory device 895A is available ('YES' at step S2209), that is, when the flag corresponding to the first spare memory device 895A has a value of one (1), the processor of the first memory blade 800A may control the first spare memory device 895A to perform the backup operation for the defective memory device at step S2213.

When the first spare memory device 895A is not available ('NO' at step S2209), that is, when the flag corresponding to the first spare memory device 895A has a value of zero (0), the memory blade management unit 950 may control the first memory blade 800A to suspend the corresponding backup operation for a while at step S2211. Further, the computing device 900 may repeat steps S2205 to S2211 until an available spare memory device is detected.

FIGS. 23A to 23D are flowcharts schematically illustrating operations of a memory blade according to embodiments of the present disclosure. In particular, FIGS. 23A to 23D show operations of a computing device to detect a defective memory device by checking a status of each of a plurality of memory devices in a memory blade. The operations of the computing device shown in FIGS. FIGS. 23A to 23D will be described with reference to FIGS. 19 and 20.

Figure 23A:
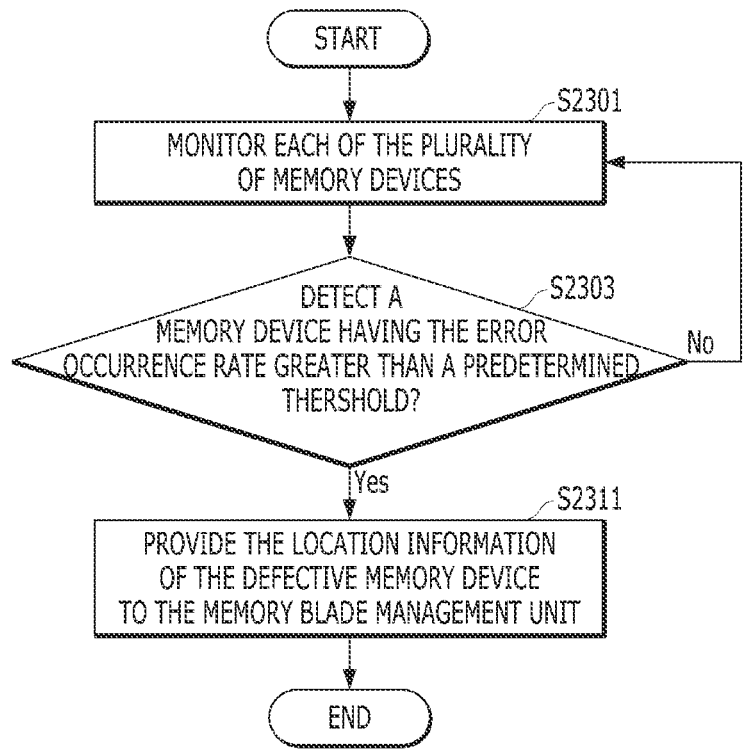
FIG. 23A is a flowchart illustrating an operation of a memory blade for detecting a defective memory device based on a first parameter in accordance with an embodiment of the present disclosure.

FIG. 23A is a flowchart illustrating an operation of the memory blade 800 of FIG. 19 for detecting a defective memory device based on a first parameter. The first parameter may represent an error occurrence rate or error occurrence frequency of a memory device in the memory blade 800.

At step S2301, the monitor 810 of the memory blade 800 may periodically monitor the plurality of memory devices 891 to 89N. For example, the monitor 810 may periodically check whether there occurs an error in each of the plurality of memory devices 891 to 89N.

At step S2303, the monitor 810 may detect a memory device, which has an error occurrence rate that is greater than a first predetermined threshold value, as a defective memory device, among the plurality of memory devices 891 to 89N.

When there is no memory device having an error occurrence rate that is greater than the first predetermined threshold value among the plurality of memory devices 891 to 89N ('NO' at step S2303), the monitor 810 may repeat steps S2301 and S2303.

When there is the memory device having the error occurrence rate that is greater than the first predetermined threshold value among the plurality of memory devices 891 to 89N ('YES' at step S2303), the monitor 810 may store location information of the detected defective memory device.

At step S2311, the monitor 810 may provide the location information of the defective memory device to the memory blade management unit 950 shown in FIG. 20.

Figure 23B:
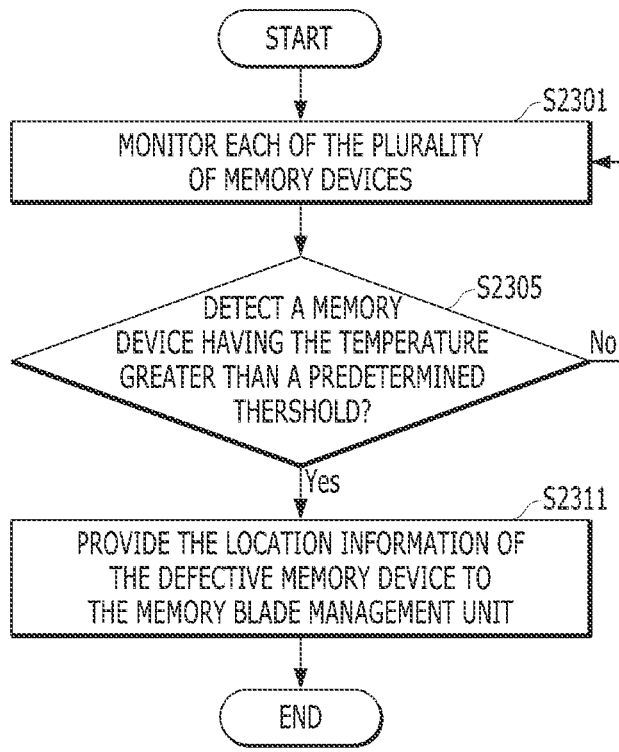
FIG. 23B is a flowchart illustrating an operation of a memory blade for detecting a defective memory device based on a second parameter in accordance with an embodiment of the present disclosure.

FIG. 23B is a flowchart illustrating an operation of the memory blade 800 for detecting a defective memory device based on a second parameter. The second parameter may represent a temperature of a memory device in the memory blade 800.

At step S2301, the monitor 810 of the memory blade 800 may periodically monitor the plurality of memory devices 891 to 89N. For example, the monitor 810 may periodically check a temperature in each of the plurality of memory devices 891 to 89N.

At step S2305, the monitor 810 may detect a memory device, which has a temperature that is greater than a second predetermined threshold value, as a defective memory device, among the plurality of memory devices 891 to 89N.

When there is no memory device having a temperature that is greater than the second predetermined threshold value among the plurality of memory devices 891 to 89N ('NO' at step S2305), the monitor 810 may repeat steps S2301 and S2305.

When there is the memory device having the temperature that greater than the second predetermined threshold value among the plurality of memory devices 891 to 89N ('YES' at step S2305), the monitor 810 may store location information of the detected defective memory device.

At step S2311, the monitor 810 may provide the location information of the defective memory device to the memory blade management unit 950 shown in FIG. 20.

Figure 23C:
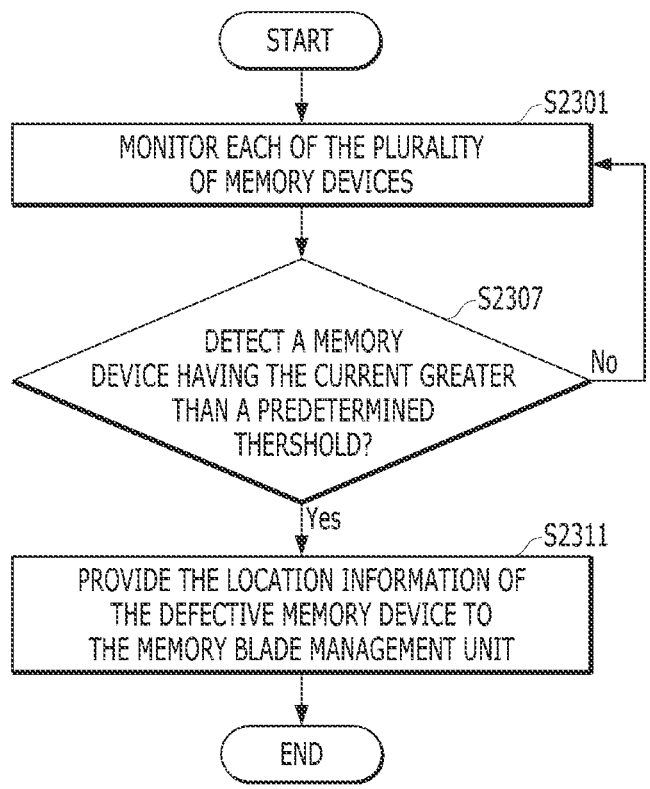
FIG. 23C is a flowchart illustrating an operation of a memory blade for detecting a defective memory device based on a third parameter in accordance with an embodiment of the present disclosure.

FIG. 23C is a flowchart illustrating an operation of the memory blade 800 for detecting a defective memory device based on a third parameter. The third parameter may represent a current flowing in a memory device in the memory blade 800.

At step S2301, the monitor 810 of the memory blade 800 may periodically monitor the plurality of memory devices 891 to 89N. For example, the monitor 810 may periodically identify a current flowing in each of the plurality of memory devices 891 to 89N.

At step S2307, the monitor 810 may detect a memory device, which has a current that is greater than a third predetermined threshold value, as a defective memory device, among the plurality of memory devices 891 to 89N.

When there is no memory device having a current that is greater than the third predetermined threshold value among the plurality of memory devices 891 to 89N ('NO' at step S2307), the monitor 810 may repeat steps S2301 and S2307.

When there is the memory device having the current that is greater than the third predetermined threshold value among the plurality of memory devices 891 to 89N ('YES' at step S2307), the monitor 810 may store location information of the detected defective memory device.

At step S2311, the monitor 810 may provide the location information of the defective memory device to the memory blade management unit 950 shown in FIG. 20.

Figure 23D:
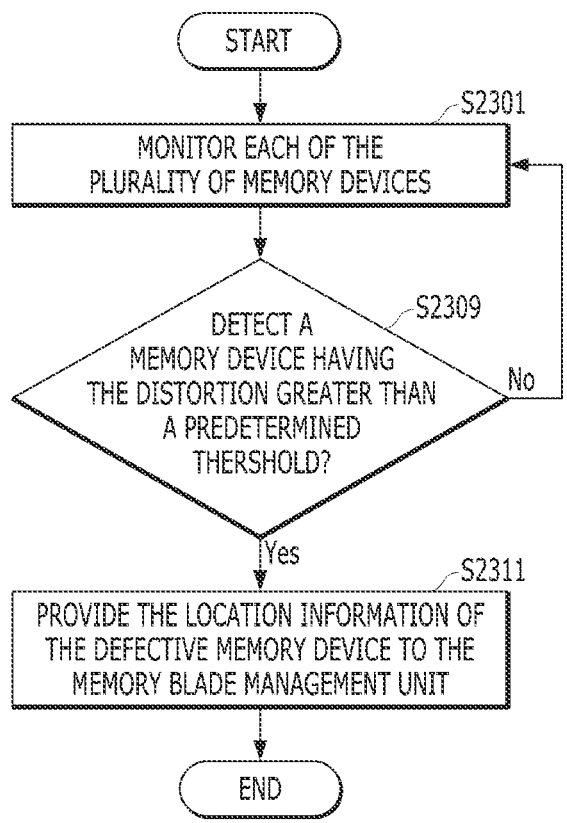
FIG. 23D is a flowchart illustrating an operation of a memory blade for detecting a defective memory device based on a fourth parameter in accordance with an embodiment of the present disclosure.

FIG. 23D is a flowchart illustrating an operation of the memory blade 800 for detecting a defective memory device based on a fourth parameter. The fourth parameter may represent a distortion of a memory device in the memory blade 800. The distortion may include duty cycle distortion, signal distortion, cell array distortion and so on.

At step S2301, the monitor 810 of the memory blade 800 may periodically monitor the plurality of memory devices 891 to 89N. For example, the monitor 810 may periodically check a distortion in each of the plurality of memory devices 891 to 89N.

At step S2309, the monitor 810 may detect a memory device, which has a distortion that is greater than a fourth predetermined threshold value, as a defective memory device, among the plurality of memory devices 891 to 89N.

When there is no memory device having a distortion that is greater than the fourth predetermined threshold value among the plurality of memory devices 891 to 89N ('NO' at step S2309), the monitor 810 may repeat steps S2301 and S2309.

When there is the memory device having the distortion that is greater than the fourth predetermined threshold value among the plurality of memory devices 891 to 89N ('YES' at step S2309), the monitor 810 may store location information of the detected defective memory device.

At step S2311, the monitor 810 may provide the location information of the defective memory device to the memory blade management unit 950 shown in FIG. 20.

Figure 24:
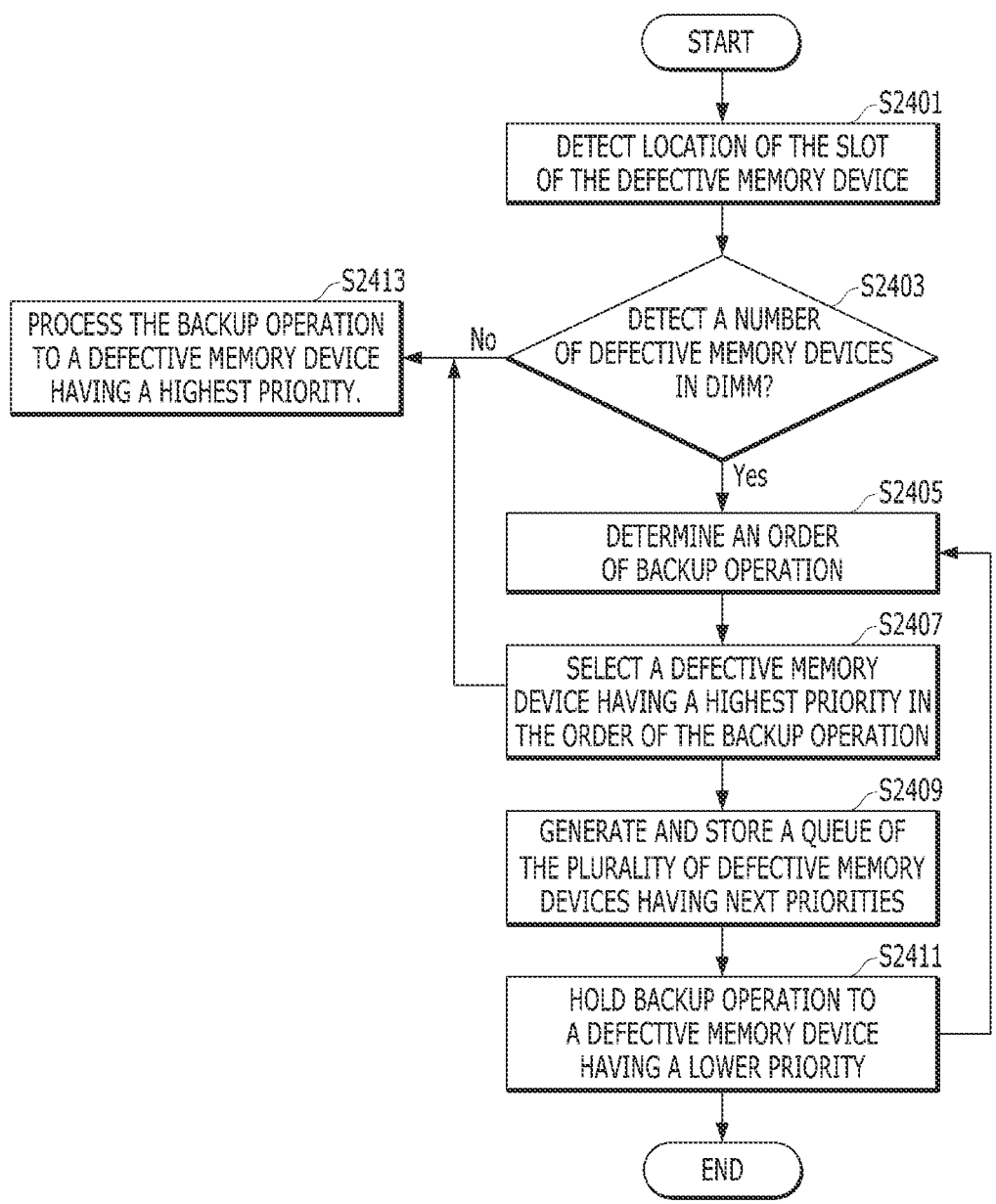
FIG. 24 is a flowchart schematically illustrating an operation of a memory blade in accordance with an embodiment of the present disclosure.

FIG. 24 is a flowchart schematically illustrating an operation of a memory blade according to an embodiment of the present disclosure. FIG. 24 shows an operation of the memory blade 800 of FIG. 19 for sequentially performing backup operations for a plurality of defective memory devices by setting priorities of the backup operations when the plurality of defective memory devices are detected in the memory blade 800.

At step S2401, the monitor 810 may detect a location of a DIMM slot on which a defective memory device is mounted, and may store location information of the defective memory device.

At step S2403, it is determined whether the monitor 810 detects a number of defective memory devices or not.

When an error occurs at a single DIMM slot ('NO' at step S2403), the memory blade 800 may perform a backup operation for a defective memory device on the single DIMM slot at step S2413.

When errors occur at a plurality of DIMM slots ('Yes' at step S2403), at the step S2405, the monitor 810 may determine a processing order of backup operations to be performed on the plurality of defective memory devices based on the first to fourth parameters described with reference to FIGS. 23A to 23D. The monitor 810 may store the determined processing order. For example, the monitor 810 may set the processing order of the backup operations such that a defective memory device having an error occurrence rate that is greater than the first predetermined threshold value has a higher priority than a defective memory device having a current that is greater than the third predetermined threshold value.

At step S2407, the processor 830 may select a defective memory device having a highest priority in the processing order of the backup operations and a corresponding spare memory device 895 to perform a backup operation for the defective memory device based on the processing order of the backup operations.

At step S2409, the monitor 810 may generate and store a queue of the plurality of defective memory devices having next priorities. For example, a defective memory device having an error occurrence rate that is greater than the first predetermined threshold value, a defective memory device having a current that is greater than the third predetermined threshold value, and a defective memory device having a temperature that is greater than the second predetermined threshold value may be sequentially included in the queue.

At step S2411, the memory blade management unit 950 shown in FIG. 20 may control the memory blade 800 not to perform a backup operation to a defective memory device having a lower priority until a backup operation is completed to a defective memory device having a higher priority in the processing order of the backup operations. After the backup operation is completed to the defective memory device having the higher priority in the processing order of the backup operations, the computing device 900 may repeat steps S2405 to S2411 for the other defective memory devices having lower priorities.

Figure 25:
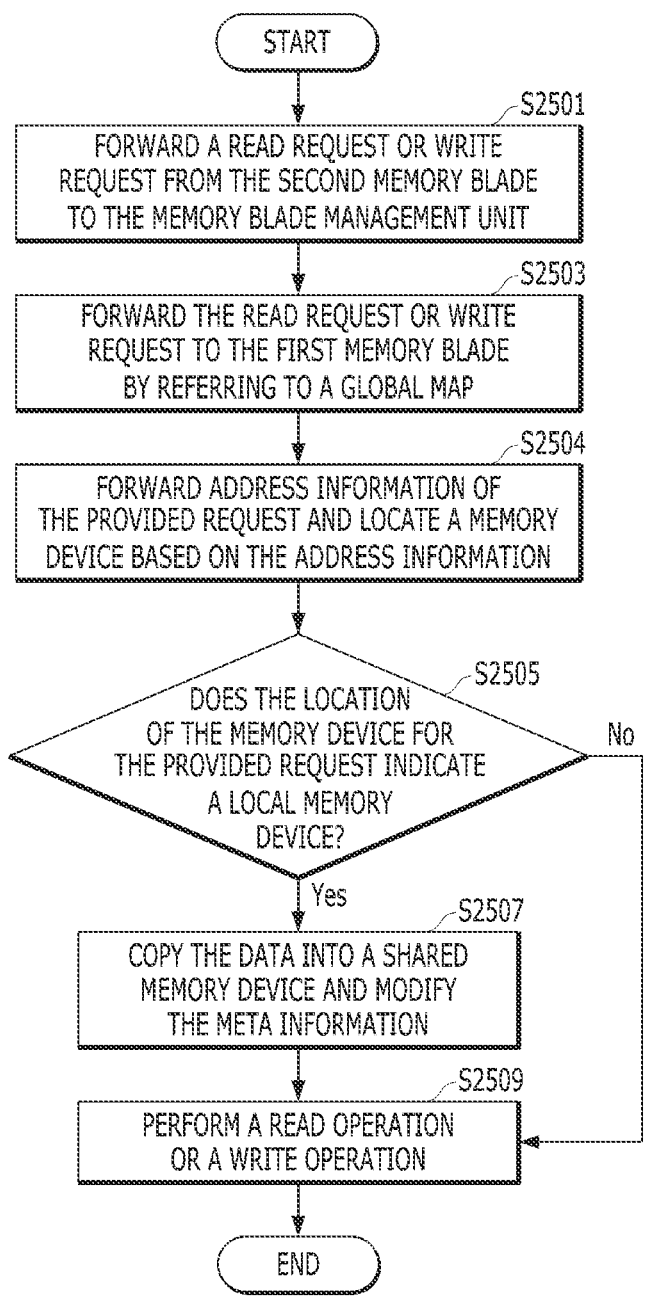
FIG. 25 is a flowchart illustrating an operation of a computing device in accordance with an embodiment of the present disclosure.

FIG. 25 is a flowchart illustrating an operation of a computing device in accordance with an embodiment of the present disclosure. FIG. 25 shows an operation of the plurality of memory blades 800A to 800M shown in FIG. 20 for communicating with one another through the memory blade management unit 950. Hereinafter, the operation of the computing device shown in FIG. 25 will be described with the first memory blade 800A and the second memory blade 800B shown in FIG. 20. It is assumed that the second controller 870B of the second memory blade 800B provides a read request or write request to the first memory blade 800A.

At step S2501, a second node controller included in the second controller 870B may forward the read request or write request to the memory blade management unit 950.

At step S2503, the memory blade management unit 950 may forward the read request or write request, which is provided from the second node controller of the second controller 870B, to a first node controller included in the first controller 870A by referring to a global map.

At step S2504, the first node controller of the first controller 870A may forward address information of the provided request to a first address router included in the first controller 870A. Further, the first address router of the first controller 870A may identify the address information based on meta information of data for the provided request, and may locate a memory device in the first memory blade 800A. That is, the first address router of the first controller 870A may set a data path.

At step S2505, it is determined whether the location of the memory device for the provided request indicates a local memory device in the first memory blade 800A or not.

When the location of the memory device for the provided request indicates the local memory device ('YES' at step S2505), a first processor of the first controller 870A may control the local memory device to copy the data for the provided request, which is stored in the local memory device, into the first shared memory device 885A at step S2507. The first address router of the first controller 870A may modify the meta information to indicate that the data for the provided request is copied from the local memory device to the first shared memory device 885A.

At step S2509, the first memory blade 800A may perform a read operation or a write operation in response to the provided request.

For example, when the provided request is the read request, the first processor may control the local memory device to read data in response to the read request. The read data may be forwarded to the second memory blade 800B through the first node controller and the memory blade management unit 950.

For example, when the provided request is the write request, the first processor 830 may control the first shared memory device 885A to perform a write operation on the data, which is copied into the first shared memory device 885A at step S2507. The first address router of the first controller 870A may modify the meta information to indicate that the data stored in the local memory device is different from data stored in the first shared memory device 885A that is updated by the write operation.

When the location of the memory device for the provided request indicates the first shared memory device 885A ('NO' at step S2505), at step S2509, the first memory blade 800A may perform the read operation or the write operation with the first shared memory device 885A in response to the provided request, as described above.

Although not illustrated, data stored in the shared memory devices 885 may be managed using queues, as described with reference to FIG. 19. When the number of the queues is greater than a threshold value, the data stored in the shared memory devices 885 may be moved to a local memory device. For example, a first processor in the first memory blade 800A may copy data stored in a local memory device into the first shared memory devices 885A in response to a request provided from the second memory blade 800B. When the request provided from the second memory blade 800B is repeated, the first shared memory devices 885A may be full of copied data. Since a first address router in the first memory blade 800A may manage the data stored in the first shared memory devices 885A using the queues, when the first shared memory devices 885A may be full of copied data and thus the number of the queues is greater than the threshold value, the first address router in the first memory blade 800A may forward information of the queues to the first processor. The first processor may control the local memory device and the first shared memory devices 885A to copy data from the first shared memory devices 885A into the local memory device by referring to meta information of the data.

Figure 26:
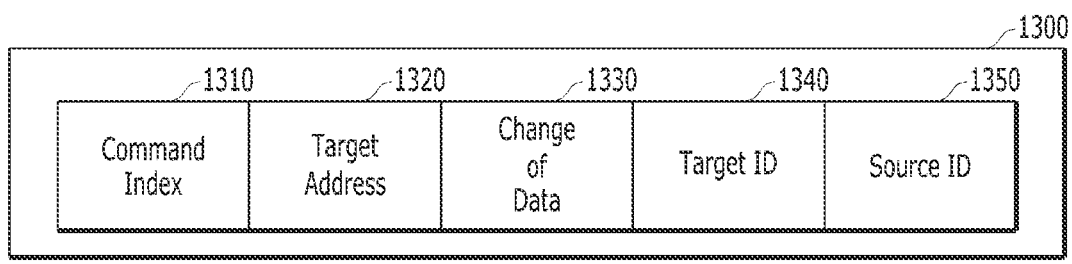
FIG. 26 is a diagram schematically illustrating a structure of meta information in accordance with an embodiment of the present disclosure.

FIG. 26 is a diagram schematically illustrating a structure of meta information 1900 in accordance with an embodiment of the present disclosure.

FIG. 26 exemplifies the meta information 1300 that includes various fields such as a command index field 1310, a target address field 1320, a change of data field 1330, a target ID field 1340, a source ID field 1350, and so forth. The command index field 1310 may provide a reception order of requests provided from other memory blades, and the target address field 1320 may provide a location of a memory device for the provided request. The change of data field 1330 may provide whether data can be changed in response to the provided request, the target ID field 1340 may provide ID information of a memory blade that is a destination of the provided request, and the source ID field 1350 may provide ID information of a memory blade that is a source of the provided request.

For example, when the second memory blade 800B provides a read request for read data to the first memory blade 800A, the read data being to be changed, the first memory blade 800A may generate the meta information 1300 for the read data by storing order information of the read request in the command index field 130, information indicating that the read data may be changed in the change of data field 1330, and an ID of the second memory blade 800B in the source ID field 1350. The requested read data may be copied into the shared memory devices 885A, and the address router of the first memory blade 800A may update an address table included in the shared memory devices 885A. When the provided request from the second memory blade 800B does not require change of corresponding data, the read data may not be copied into the shared memory devices 885A. When the second memory blade 800B provides a read request to the same memory device, the first memory blade 800A may select the shared memory devices 885A as a memory device corresponding to the read request.

In accordance with an embodiment of the present disclosure, power domains of shared memory devices included in a plurality of memory blades may be separated from one another. Therefore, the connection among a node controller, an address router, and a shared memory device may be maintained even when an error occurs in memory devices other than the controller and the shared memory device, which prevents an error from occurring in the whole system. Further, an error occurring in the whole system may be prevented even though errors occur in a part of the plurality of memory blades.

Although various embodiments have been described for illustrative purposes, it will be apparent to those skilled in the art that various changes and modifications may be made without departing from the spirit and scope of the invention as defined in the following claims.

What is claimed is:

1. A data processing system comprising:
   a plurality of memory systems and a compute system,
   wherein each of the plurality of memory systems includes:
   a plurality of memory devices each configured to store data, correct an error of the data and generate first error information including error details, and
   a controller configured to acquire the first error information from the plurality of memory devices and generate second error information based on plural pieces of first error information received from the plurality of memory devices; and
   wherein the compute system analyzes the second error information received from the plurality of memory systems.

2. The data processing system of claim 1,
   wherein when an uncorrectable error occurred in a memory device included in a first memory device among the plurality of memory systems, a controller included of a first memory system provides a fatal signal to the compute system, and
   wherein the compute system shuts down the first memory system in response to the fatal signal.

3. The data processing system of claim 1,
   wherein each of the plurality of memory devices further includes a serial presence detect (SPD) component including characteristic data,
   wherein the error details include manufacturing information included in characteristic data of a memory device which an error occurred, and
   wherein the compute system extracts the manufacturing information from error details of the second error information, categorizes the second error information according to the manufacturing information and analyzes the categorized second error information.

* * * * *